US011101283B2

(12) United States Patent
Kim et al.

(10) Patent No.: US 11,101,283 B2
(45) Date of Patent: Aug. 24, 2021

(54) SEMICONDUCTOR MEMORY DEVICE

(71) Applicant: Samsung Electronics Co., Ltd., Suwon-si (KR)

(72) Inventors: Hui-Jung Kim, Seongnam-si (KR); Kiseok Lee, Hwaseong-si (KR); Keunnam Kim, Yongin-si (KR); Yoosang Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 49 days.

(21) Appl. No.: 16/508,839

(22) Filed: Jul. 11, 2019

(65) Prior Publication Data
US 2020/0043941 A1 Feb. 6, 2020

(30) Foreign Application Priority Data

Aug. 3, 2018 (KR) ........................ 10-2018-0090647

(51) Int. Cl.
*H01L 27/11578* (2017.01)
*H01L 27/11573* (2017.01)
*H01L 27/1157* (2017.01)

(52) U.S. Cl.
CPC .... *H01L 27/11578* (2013.01); *H01L 27/1157* (2013.01); *H01L 27/11573* (2013.01)

(58) Field of Classification Search
None
See application file for complete search history.

(56) References Cited

U.S. PATENT DOCUMENTS

| | | |
|---|---|---|
| 8,501,609 B2 | 8/2013 | Roizin et al. |
| 8,912,591 B2 | 12/2014 | Baek et al. |
| 9,030,858 B2 | 5/2015 | Or-Bach et al. |
| 9,117,749 B1 | 8/2015 | Or-Bach et al. |
| 9,514,792 B2 | 12/2016 | Kajigaya |
| 9,831,118 B1 | 11/2017 | Pang et al. |
| 10,199,326 B1* | 2/2019 | Ohsaki ................. H01L 23/481 |
| 2009/0261314 A1* | 10/2009 | Kim ..................... H01L 27/249 257/4 |
| 2010/0038719 A1 | 2/2010 | Kim et al. |
| 2013/0052803 A1* | 2/2013 | Roizin ................ H01L 29/7881 438/478 |
| 2013/0292847 A1* | 11/2013 | Choi ................. H01L 21/76897 257/774 |
| 2016/0005762 A1 | 1/2016 | Lue |
| 2016/0071591 A1 | 3/2016 | Hsu |
| 2017/0053906 A1 | 2/2017 | Or-Bach et al. |
| 2017/0084615 A1* | 3/2017 | Lee ................... H01L 27/10876 |
| 2017/0351570 A1 | 12/2017 | Laity et al. |

* cited by examiner

*Primary Examiner* — Hsien Ming Lee
(74) *Attorney, Agent, or Firm* — Harness, Dickey & Pierce, P.L.C.

(57) ABSTRACT

A semiconductor device may include a stack structure that includes a plurality of layers vertically stacked on a substrate, and a plurality of gate electrodes that vertically extend to penetrate the stack structure. Each of the plurality of layers may include a plurality of semiconductor patterns that extend in parallel along a first direction, a bit line that is electrically connected to the semiconductor patterns and extends in a second direction intersecting the first direction, a first air gap on the bit line, and a data storage element that is electrically connected to a corresponding one of the semiconductor patterns. The first air gap is interposed between the bit line of a first layer of the plurality of layers and the bit line of a second layer of the plurality of layers.

19 Claims, 37 Drawing Sheets

SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2018-0090647 filed on Aug. 3, 2018 in the Korean Intellectual Property Office, the entire contents of which are hereby incorporated by reference.

BACKGROUND

Example embodiments of the present inventive concepts relate to a semiconductor device. For example, at least some example embodiments relate to a three-dimensional semiconductor memory device with increased integration.

Semiconductor devices have been highly integrated for satisfying high performance and low manufacture costs demanded by customers. Since integration of semiconductor devices is an important factor in determining product price, high integrated semiconductor devices are increasingly demanded. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide a three-dimensional semiconductor memory device with improved electrical characteristics.

According to some example embodiments of the present inventive concepts, a semiconductor device may include a plurality of gate electrodes; and a stack structure including a plurality of layers vertically stacked on a substrate, the plurality of gate electrodes vertically extending such that the plurality of gate electrodes penetrate the stack structure. Each layer of the plurality of layers may include a plurality of semiconductor patterns extending in parallel along a first direction, a bit line electrically connected to the semiconductor patterns and extending in a second direction, the second direction intersecting the first direction, a first air gap between the bit line of a first layer of the plurality of layers and the bit line of a second layer of the plurality of layers, and a data storage element electrically connected to a corresponding one of the semiconductor patterns.

According to some example embodiments of the present inventive concepts, a semiconductor device may include a stack structure including a plurality of layers vertically stacked on a substrate, each of the plurality of layers including, a plurality of semiconductor patterns extending in parallel along a first direction, a bit line electrically connected to the semiconductor patterns and extending in a second direction, the second direction intersecting the first direction, and a data storage element that is electrically connected to a corresponding one of the semiconductor patterns; a plurality of gate electrodes vertically extending to penetrate the stack structure; and a structure between the bit line of a first layer of the plurality of layers and the bit line of a second layer the plurality of layers adjacent to the first layer such that the structure reduces coupling capacitance between adjacent ones of the bit lines, the structure including one of a first air gap and a first shield line.

According to some example embodiments of the present inventive concepts, a semiconductor device may include a stack structure including a plurality of layers vertically stacked on a substrate, the plurality of layers including, a first semiconductor pattern and a second semiconductor pattern extending in parallel along a first direction, a bit line electrically connected to the first semiconductor pattern and the second semiconductor pattern, the bit line extending in a second direction intersecting the first direction, and a data storage element electrically connected to a corresponding one of the first semiconductor pattern and the second semiconductor pattern; a first gate electrode and a second gate electrode, the first gate electrode and the second gate electrode vertically extending in a hole penetrating the stack structure, the first gate electrode and the second gate electrode being adjacent to the first semiconductor pattern and the second semiconductor pattern, respectively; and a structure between the first gate electrode and the second gate electrode such that the structure reduces coupling capacitance between the first gate electrode and the second gate electrode, the structure including one of a first air gap and a first shield line.

DETAILED DESCRIPTION

Figure 1:
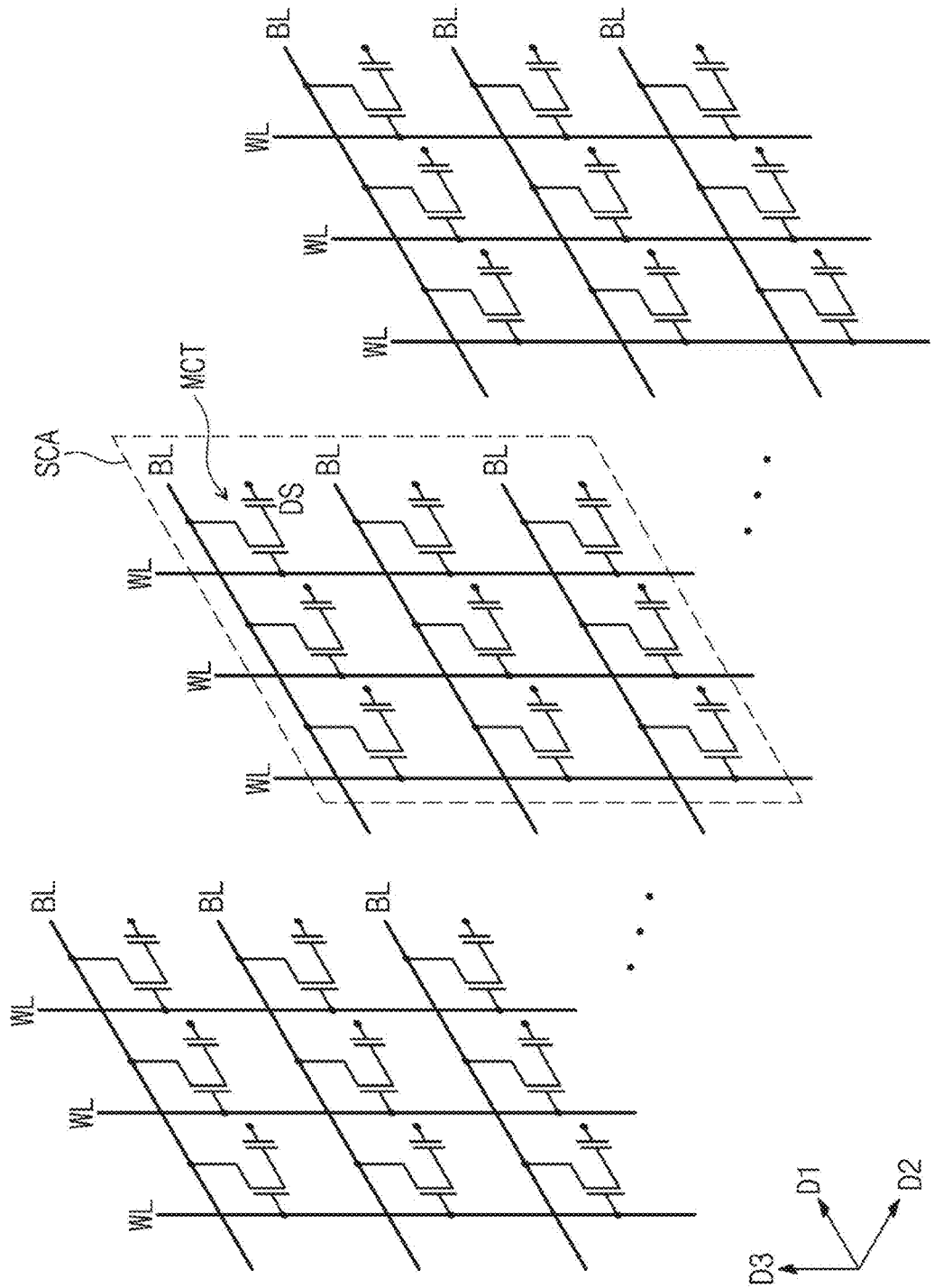
FIG. 1 illustrates a simplified circuit diagram showing a cell array of a three-dimensional semiconductor memory device according to some example embodiments of the present inventive concepts.

FIG. 1 illustrates a simplified circuit diagram showing a cell array of a three-dimensional semiconductor memory device according to some example embodiments of the present inventive concepts.

Referring to FIG. 1, a three-dimensional semiconductor memory device according to some example embodiments of the present inventive concepts may include a cell array that consists of a plurality of sub-cell arrays SCA. The sub-cell arrays SCA may be arranged along a second direction D2.

Each of the sub-cell arrays SCA may include a plurality of bit lines BL, a plurality of word lines WL, and a plurality of memory cell transistors MCT. One memory cell transistor MCT may be disposed between one word line WL and one bit line BL.

The bit lines BL may be conductive patterns (e.g., metal lines) spaced apart from and disposed on a substrate. The bit lines BL may extend in a first direction D1. The bit lines BL in one sub-cell array SCA may be spaced apart from each other in a vertical direction (e.g., a third direction D3).

The word lines WL may be conductive patterns (e.g., metal lines) that extend in a direction (e.g., the third direction D3) perpendicular to the substrate. The word lines WL in one sub-cell array SCA may be spaced apart from each other in the first direction D1.

A gate of the memory cell transistor MCT may be connected to the word line WL, and a source of the memory cell transistor MCT may be connected to the bit line BL. Each of the memory cell transistors MCT may include a data storage element DS. For example, the data storage element DS may be a capacitor, and a drain of the memory cell transistor MCT may be connected to the capacitor.

Figure 2:
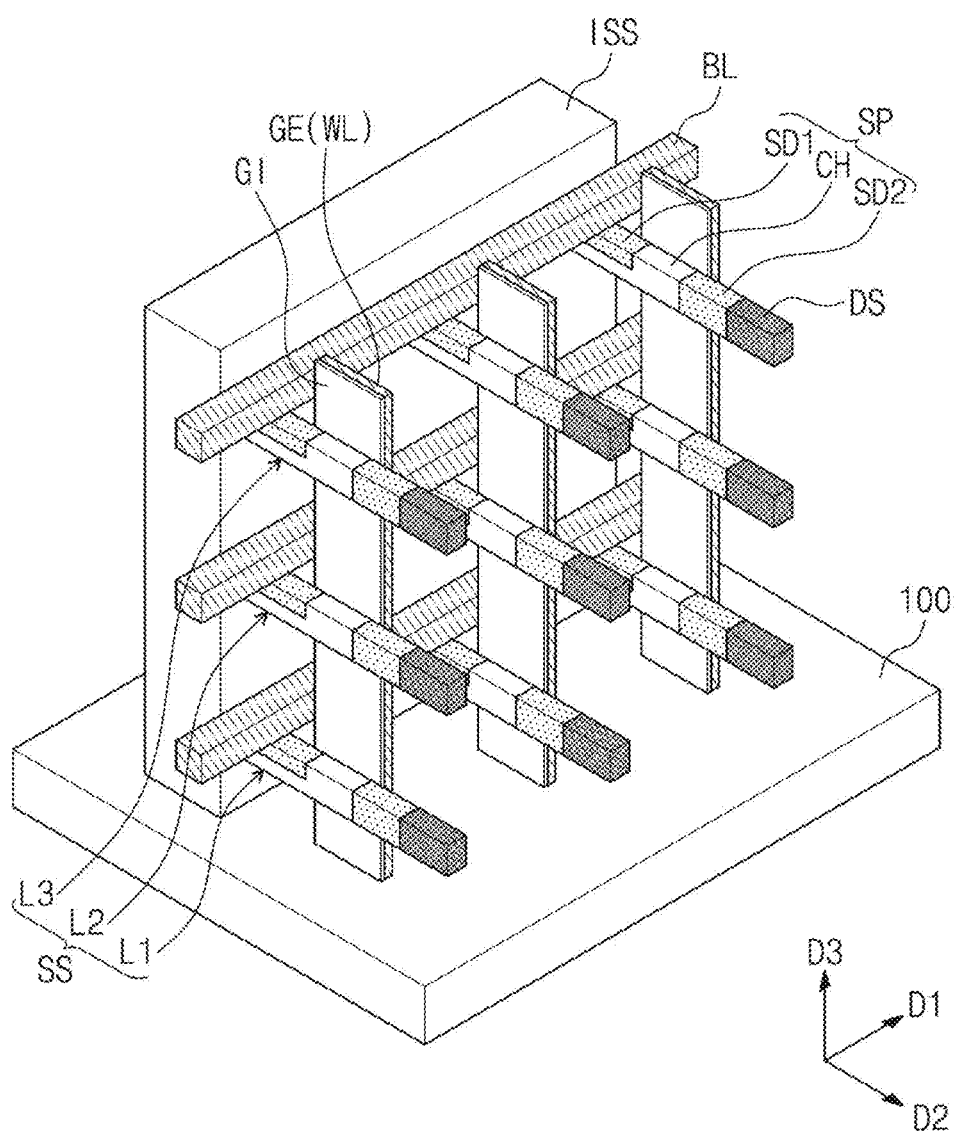
FIG. 2 illustrates a perspective view showing a three-dimensional semiconductor memory device according to some example embodiments of the present inventive concepts.

FIG. 2 illustrates a perspective view showing a three-dimensional semiconductor memory device according to some example embodiments of the present inventive concepts.

Referring to FIGS. 1 and 2, a substrate 100 may be provided thereon with one of the plurality of sub-cell arrays SCA discussed with reference to FIG. 1. The substrate 100 may be a silicon substrate, a germanium substrate, or a silicon-germanium substrate.

For example, the substrate 100 may be provided thereon with a stack structure SS including first, second, and third layers L1, L2, and L3. The first, second, and third layers L1, L2, and L3 of the stack structure SS may be spaced apart and stacked in a vertical direction (e.g., a third direction D3). Each of the first, second, and third layers L1, L2, and L3 may include a plurality of semiconductor patterns SP, a plurality of data storage elements DS, and a bit line BL.

The semiconductor patterns SP may have linear, bar, or pillar shapes that extend in a second direction D2. For example, the semiconductor patterns SP may include silicon, germanium, silicon-germanium, or indium gallium zinc oxide (IGZO). Each of the semiconductor patterns SP may include a channel region CH, a first impurity region SD1, and a second impurity region SD2. The channel region CH may be interposed between the first and second impurity regions SD1 and SD2. The channel region CH may correspond to a channel of the memory cell transistor MCT discussed with reference to FIG. 1. The first and second impurity regions SD1 and SD2 may correspond to the source and drain of the memory cell transistor MCT discussed with reference to FIG. 1.

The first and second impurity regions SD1 and SD2 may be regions where the semiconductor pattern SP is doped with impurities. The first and second impurity regions SD1 and SD2 may have n-type or p-type conductivity. The first impurity region SD1 may be formed on an upper portion of the semiconductor pattern SP.

The data storage elements DS may be connected to corresponding ends of the semiconductor patterns SP. The data storage elements DS may be connected to corresponding second impurity regions SD2 of the semiconductor patterns SP. The data storage elements DS may be memory elements capable of storing data. Each of the data storage elements DS may be a memory element using one of a capacitor, a magnetic tunnel junction pattern, and a variable resistance member including a phase change material. For example, each of the data storage elements DS may be a capacitor.

The bit lines BL may have linear or bar shapes extending in a first direction D1. The bit lines BL may be spaced apart from each other and stacked along the third direction D3. The bit lines BL may include a conductive material. For example, the conductive material may include one or more of a doped semiconductor material (doped silicon, doped germanium, etc.), a conductive metal nitride material (titanium nitride, tantalum nitride, etc.), a metallic material (tungsten, titanium, tantalum, etc.), and a metal-semiconductor compound (tungsten silicide, cobalt silicide, titanium silicide, etc.). The bit lines BL may be the bit lines BL discussed with reference to FIG. 1.

Among the first, second, and third layers L1, L2, and L3, the first layer L1 will be representatively described in detail below. The semiconductor patterns SP of the first layer L1 may be arranged spaced apart from each other in the first direction D1. The semiconductor patterns SP of the first layer L1 may be located at the same first level. The bit line BL of the first layer L1 may be disposed on the semiconductor patterns SP of the first layer L1. The bit line BL may be disposed on top surfaces of the semiconductor patterns SP. The bit line BL may be disposed on top surfaces of the first impurity regions SD1 of the semiconductor patterns SP. For example, the bit line BL may be directly connected to the first impurity regions SD1. For another example, the bit line BL may be electrically connected through metal silicide to the first impurity regions SD1. The above detailed description of the first layer L1 may also be substantially applicable to the second and third layers L2 and L3.

The substrate 100 may be provided thereon with gate electrodes GE that penetrate the stack structure SS. The gate electrodes GE may have linear or bar shapes extending in the third direction D3. The gate electrodes GE may be arranged in the first direction D1. When viewed in plan, each of the gate electrodes GE may be provided between a pair of neighboring semiconductor patterns SP. Each of the gate electrodes GE may vertically extend on sidewalls of a plurality of the semiconductor patterns SP that are vertically stacked.

For example, one of the gate electrodes GE may be adjacent to a first one of the semiconductor patterns SP of the first layer L1, a first one of the semiconductor patterns SP of the second layer L2, and a first one of the semiconductor patterns SP of the third layer L3. Another of the gate electrodes GE may be adjacent to a second one of the semiconductor patterns SP of the first layer L1, a second one of the semiconductor patterns SP of the second layer L2, and a second one of the semiconductor patterns SP of the third layer L3.

The gate electrode GE may be adjacent to the channel region CH of the semiconductor pattern SP. The gate electrode GE may be provided on a sidewall of the channel region CH and may extend in the third direction D3. A gate dielectric layer GI may be interposed between the gate electrode GE and the channel region CH. The gate dielectric layer GI may include a high-k dielectric layer, a silicon oxide layer, a silicon nitride layer, a silicon oxynitride layer, or a combination thereof. For example, the high-k dielectric layer may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrodes GE may include a conductive material, which conductive material may be one of a doped semiconductor material, a conductive metal nitride material, a metallic material, and a metal-semiconductor compound. The gate electrodes GE may be the word lines WL discussed with reference to FIG. 1.

The substrate 100 may be provided thereon with a dielectric structure ISS that extends in the first direction D1 along one lateral surface of the stack structure SS. The dielectric structure ISS may be coupled to other ends of the semiconductor patterns SP. The dielectric structure ISS may include one or more of a silicon oxide layer, a silicon nitride layer, and a silicon oxynitride layer.

Although not shown, a dielectric material may fill empty spaces within the stack structure SS. For example, the dielectric material may include one or more of a silicon oxide layer, a silicon nitride layer, and a silicon oxynitride layer.

Figure 3:
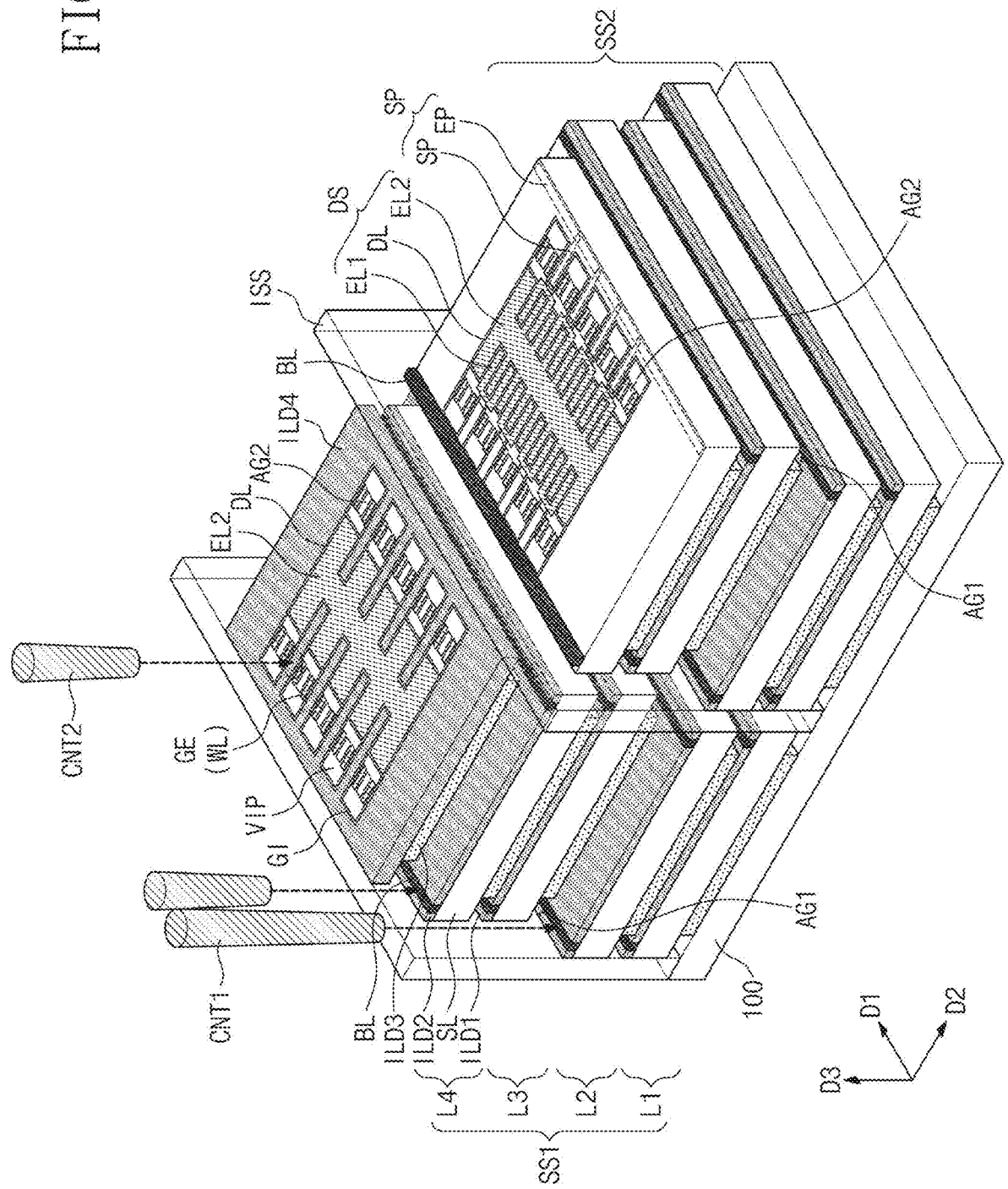
FIG. 3 illustrates a perspective view showing a three-dimensional semiconductor memory device according to some example embodiments of the present inventive concepts.
Figure 4:
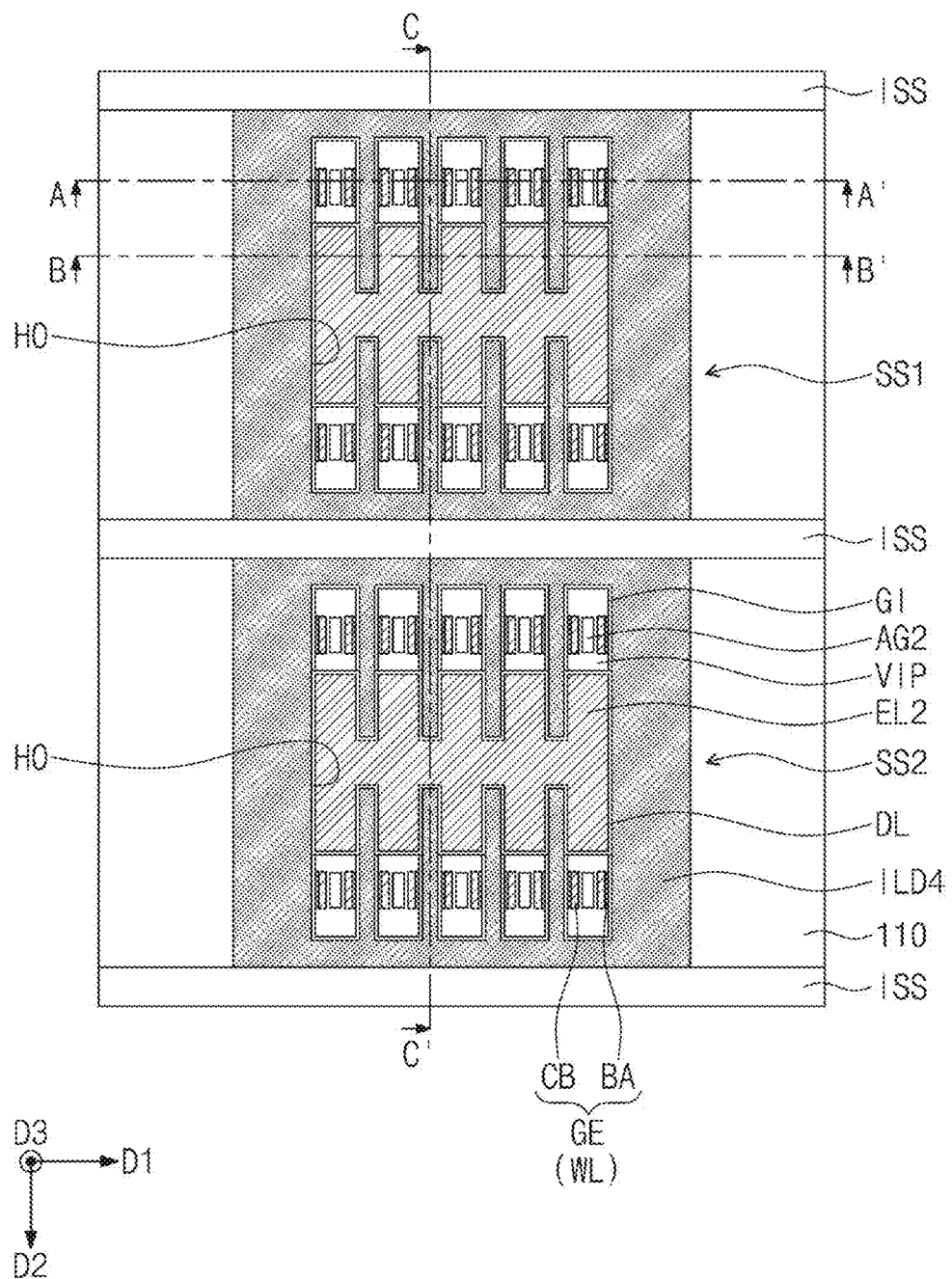
FIG. 4 illustrates a plan view showing the three-dimensional semiconductor memory device of FIG. 3.
Figure 5A:
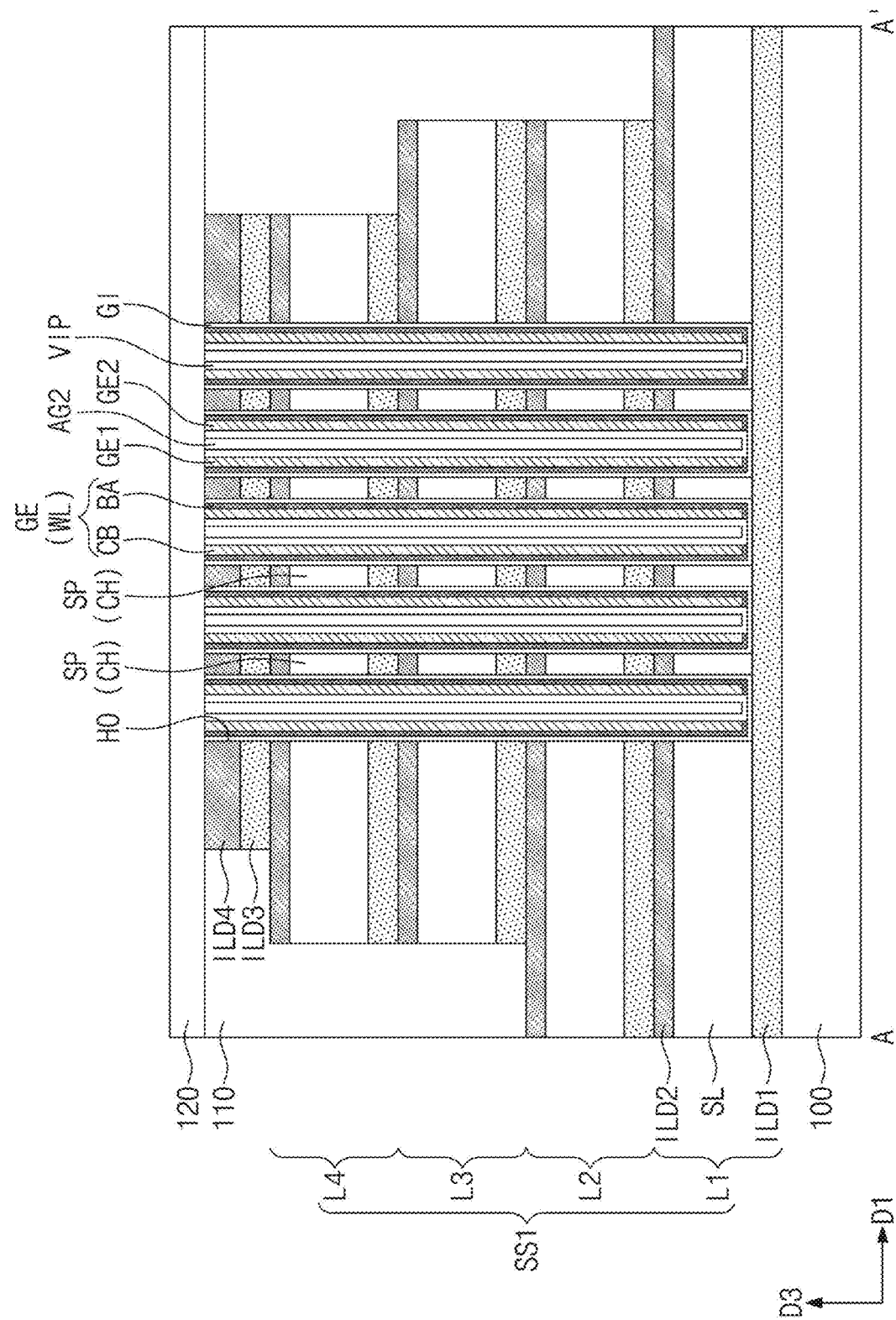
FIGS. 5A, 5B, and 5C illustrate cross-sectional views respectively taken along lines A-A', B-B', and C-C' of FIG. 4.
Figure 5B:
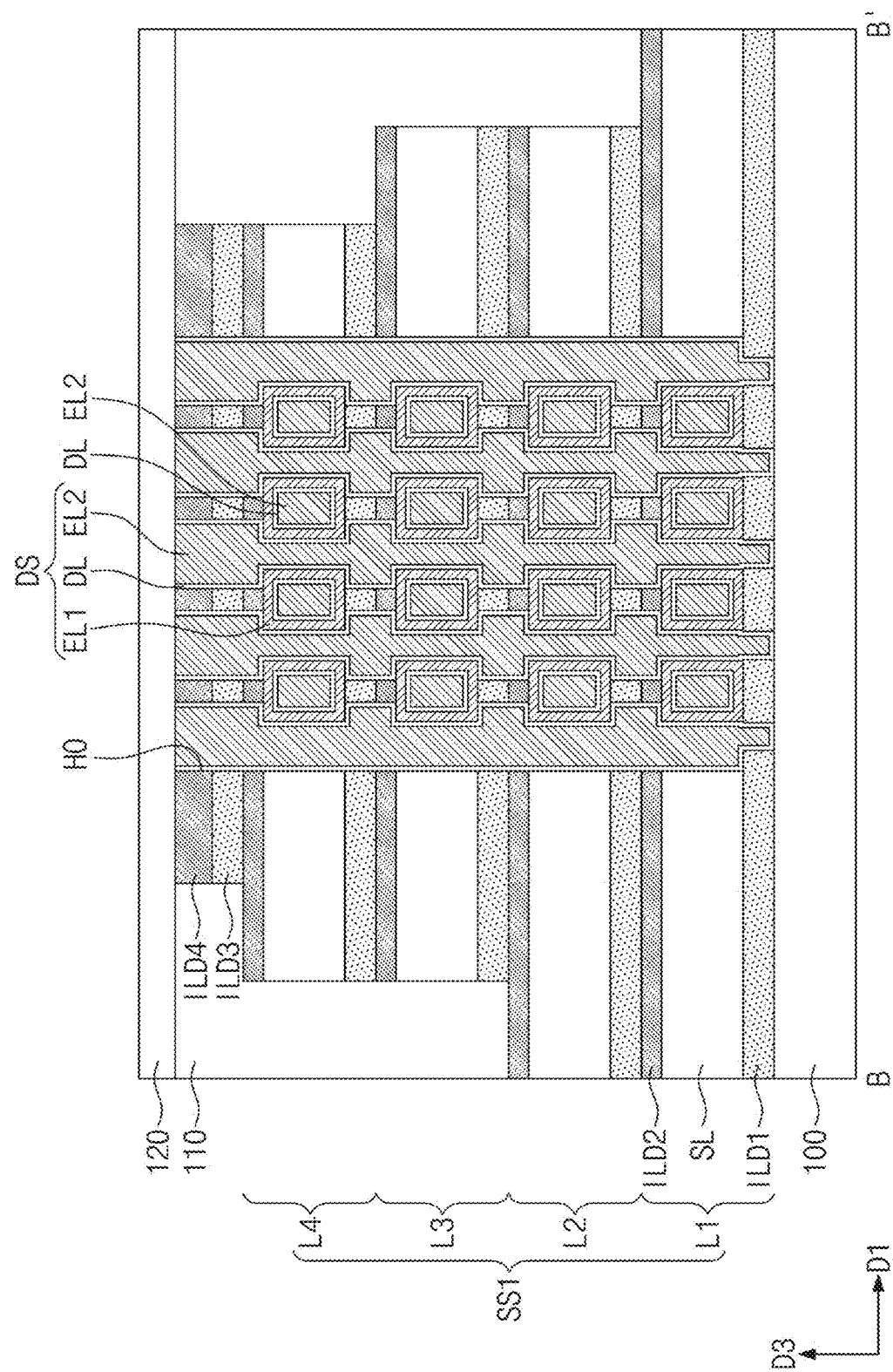
Figure 5C:
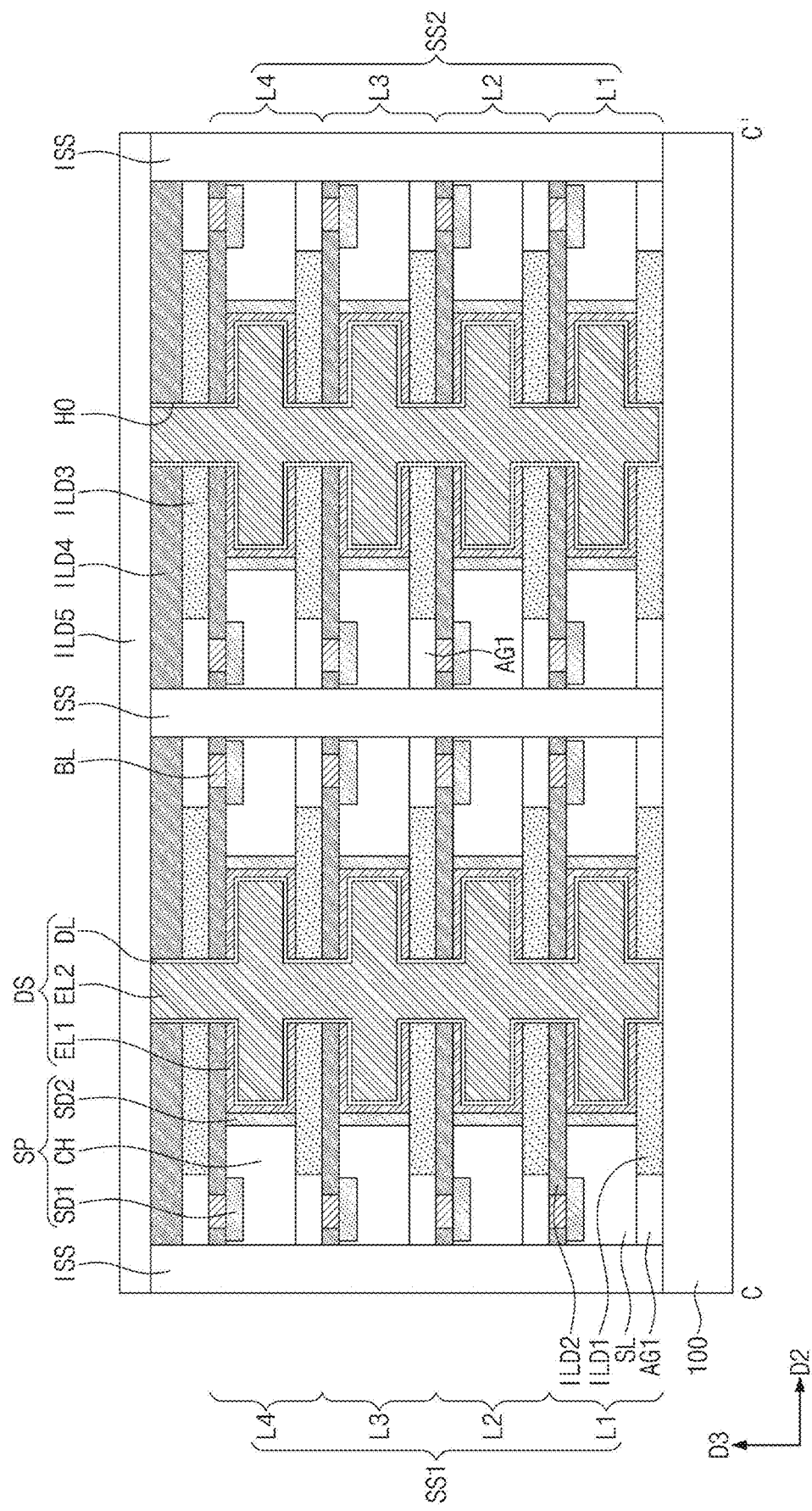

FIG. 3 illustrates a perspective view showing a three-dimensional semiconductor memory device according to some example embodiments of the present inventive concepts. FIG. 4 illustrates a plan view showing the three-dimensional semiconductor memory device of FIG. 3. FIGS. 5A, 5B, and 5C illustrate cross-sectional views respectively taken along lines A-A', B-B', and C-C' of FIG. 4. In the example embodiment that follows, a detailed description of technical features repetitive to those discussed above with reference to FIGS. 1 and 2 will be omitted, and a difference thereof will be discussed in detail.

Referring to FIGS. 3, 4, and 5A to 5C, a plurality of stack structures SS1 and SS2 may be provided on a substrate 100. The stack structures SS1 and SS2 may include a first stack structure SS1 and a second stack structure SS2. The first and second stack structures SS1 and SS2 may extend in a first direction D1. The first and second stack structures SS1 and SS2 may be arranged spaced apart from each other in a second direction D2.

Each of the first and second stack structures SS1 and SS2 may be provided on its opposite sides with dielectric structures ISS. The dielectric structures ISS may extend in the first direction D1 along the first and second stack structures SS1 and SS2. A single dielectric structure ISS may be interposed between the first and second stack structures SS1 and SS2. The dielectric structure ISS may insulate the first and second stack structures SS1 and SS2 from each other.

Each of the first and second stack structures SS1 and SS2 may include first, second, third, and fourth layers L1, L2, L3, and L4 that are sequentially stacked on the substrate 100. Each of the first, second, third, and fourth layers L1, L2, L3, and L4 may include a first dielectric layer ILD1, a semiconductor layer SL, and a second dielectric layer ILD2. The first dielectric layer ILD1, the semiconductor layer SL, and the second dielectric layer ILD2 may be sequentially stacked. The first and second dielectric layers ILD1 and ILD2 may vertically separate the semiconductor layer SL therebetween from other semiconductor layers SL.

Each of the first, second, third, and fourth layers L1, L2, L3, and L4 may further include a bit line BL that extends in the first direction D1. For example, each of the first, second, third, and fourth layers L1, L2, L3, and L4 may include two bit lines BL that are spaced apart from each other in the second direction D2. The bit line BL may be provided in the second dielectric layer ILD2. The bit line BL may be located at the same level as that of the second dielectric layer ILD2. The second dielectric layer ILD2 may cover sidewalls of the bit line BL. The bit line BL may be disposed on a top surface of the semiconductor layer SL. The bit line BL may be disposed adjacent to the dielectric structure ISS. The bit lines BL may be the bit lines BL discussed with reference to FIG. 1.

Each of the first, second, third, and fourth layers L1, L2, L3, and L4 may further include a first air gap AG1 defined when the first dielectric layer ILD1 is recessed. For example, each of the first, second, third, and fourth layers L1, L2, L3, and L4 may include two first air gaps AG1 that are spaced apart from each other in the second direction D2. The first air gap AG1 may be interposed between the bit line BL and the semiconductor layer SL. A top surface of the bit line BL may be in contact with air.

The first air gap AG1 of the first layer L1 may be defined by a bottom surface of the semiconductor layer SL, a top surface of the substrate 100, a sidewall of the first dielectric layer ILD1, and a sidewall of the dielectric structure ISS. The first air gap AG1 of each of the second, third, and fourth layers L2, L3, and L4 may be defined by a bottom surface of the semiconductor layer SL, a top surface of the bit line BL, a top surface of the second dielectric layer ILD2, a sidewall of the first dielectric layer ILD1, and a sidewall of the dielectric structure ISS.

The semiconductor layer SL may include a semiconductor material, such as silicon, germanium, silicon-germanium, or indium gallium zinc oxide (IGZO). The first and second dielectric layers ILD1 and ILD2 may include different dielectric materials from each other. The first and second dielectric layers ILD1 and ILD2 may independently include a silicon oxide layer, a silicon nitride layer, a silicon oxynitride layer, a carbon-containing silicon oxide layer, a carbon-containing silicon nitride layer, or a carbon-containing silicon oxynitride layer. For example, the first dielectric layer ILD1 may be a carbon-containing silicon oxide layer (e.g., SiOC), and the second dielectric layer ILD2 may be a silicon nitride layer (e.g., SiN).

Each of the first and second stack structures SS1 and S S2 may be configured such that one end of each of the second and third layers L2 and L3 may protrude more in the first direction D1 than one end of the fourth layer L4. The one end of the second layer L2 and the one end of the third layer L3 may be vertically aligned with each other. The one end of the first layer L1 may protrude more in the first direction D1 than the one end of each of the second and third layers L2 and L3. Other end of each of the first and second layers L1 and L2 may protrude more in an opposite direction to the first direction D1 than other end of each of the third and fourth layers L3 and L4. The other end of the first layer L1 and the other end of the second layer L2 may be vertically aligned with each other. The other end of the third layer L3 and the other end of the fourth layer L4 may be vertically aligned with each other.

A hole HO may be provided to penetrate each of the first and second stack structures SS1 and SS2. Each of the semiconductor layers SL may include semiconductor patterns SP defined by the hole HO. For example, each of the semiconductor layers SL may include an extension EP extending in the first direction D1 and semiconductor patterns SP extending in the second direction D2 from the extension EP (see FIG. 3). The hole HO may be positioned between the semiconductor patterns SP.

Each of the semiconductor patterns SP may include a channel region CH, a first impurity region SD1, and a second impurity region SD2. The channel region CH may be interposed between the first and second impurity regions SD1 and SD2. The bit line BL may be disposed on the extension EP of the semiconductor layer SL. The extension EP of each of the semiconductor layers SL may be electrically connected to the bit line BL. For example, the bit line BL may be disposed on and electrically connected to the first impurity regions SD1 of the semiconductor patterns SP.

Gate electrodes GE may be provided to extend in a vertical direction (e.g., a third direction D3) in the hole HO that penetrates a corresponding one of the first and second stack structures SS1 and SS2. For example, the gate electrodes GE may penetrate the first and second stack structures SS1 and SS2. A pair of the gate electrodes GE may be provided on opposite sides of each of the semiconductor patterns SP. For example, a pair of the gate electrodes GE may constitute one word line WL. For another example, one of the pair of the gate electrodes GE may be a word line WL, and the other of the pair of the gate electrodes GE may be a back gate.

Each of the gate electrodes GE may include a barrier pattern BA and a conductive body CB. The conductive body CB may have a linear or pillar shape extending in the third direction D3. The barrier pattern BA may cover one sidewall and a bottom surface of the conductive body CB. The conductive body CB may include metal (tungsten, titanium, tantalum, etc.), and the barrier pattern BA may include conducive metal nitride (titanium nitride, tantalum nitride, etc.). The barrier pattern BA may hinder (or, alternatively, prevent) a metallic material in the conductive body CB from diffusing into the semiconductor pattern SP.

A gate dielectric layer GI may be provided on an inner sidewall of each of the first and second stack structures SS1 and SS2, which inner sidewall is exposed to a corresponding one of the holes HO. Accordingly, the gate dielectric layer GI may be interposed between each of the semiconductor patterns SP and each of the gate electrodes GE. The barrier pattern BA of each of the gate electrodes GE may directly contact the gate dielectric layer GI.

Each of the holes HO may be provided therein with vertical dielectric patterns VIP that cover the gate electrodes GE. For example, a pair of neighboring gate electrodes GE in the hole HO may include a first gate electrode GE1 and a second gate electrode GE2. The vertical dielectric pattern VIP may be interposed between the first and second gate electrodes GE1 and GE2. The vertical dielectric pattern VIP may be interposed between a pair of neighboring semiconductor patterns SP. The vertical dielectric pattern VIP may have a pillar shape extending in the third direction D3. For example, the vertical dielectric patterns VIP may include one or more of a silicon oxide layer, a silicon nitride layer, and a silicon oxynitride layer.

A second air gap AG2 may be defined in each of the vertical dielectric patterns VIP. The second air gap AG2 may be surrounded by the vertical dielectric pattern VIP. As discussed above, a pair of neighboring gate electrodes GE in the hole HO may include the first gate electrode GE1 and the second gate electrode GE2. The second air gap AG2 may be interposed between the first and second gate electrodes GE1 and GE2. The second air gap AG2 may be defined in the vertical dielectric pattern VIP interposed between the first and second gate electrodes GE1 and GE2. The second air gap AG2 may extend in the third direction D3.

Each of the holes HO may be provided therein with data storage elements DS. The data storage elements DS may be provided in a remaining portion of the hole HO. The remaining portion of the hole HO may indicate a space that is not occupied by the gate dielectric layer GI, the gate electrodes GE, and the vertical dielectric patterns VIP.

Each of the data storage elements DS may include a first electrode EL1, a dielectric layer DL, and a second electrode EL2. The data storage elements DS in one of the first and second stack structures SS1 and SS2 may share one dielectric layer DL and one second electrode EL2. For example, in one of the first and second stack structures SS1 and SS2, the first electrode EL1 may be provided in plural, and one dielectric layer DL may cover surfaces of the plurality of first electrodes ELL. One second electrode EL2 may be provided on one dielectric layer DL.

The data storage elements DS may be connected to corresponding second impurity regions SD2 of the semiconductor patterns SP. For example, the first electrodes EL1 may be connected to corresponding second impurity regions SD2 of the semiconductor patterns SP. The second electrode EL2 may have a top surface exposed to the hole HO.

A third dielectric layer IDL3 and a fourth dielectric layer ILD4 may be provided on each of the first and second stack structures SS1 and SS2. The third dielectric layer ILD3 may include the same dielectric material as that of the first dielectric layer ILD1, and the fourth dielectric layer ILD4 may include the same dielectric layer as that of the second dielectric layer ILD2.

A first interlayer dielectric layer 110 and a second interlayer dielectric layer 120 may be provided to cover the first and second stack structures SS1 and SS2. The second interlayer dielectric layer 120 may cover a top surface of the first interlayer dielectric layer 110 and a top surface of the fourth dielectric layer ILD4. For example, the first and second interlayer dielectric layers 110 and 120 may include one or more of a silicon oxide layer, a silicon nitride layer, and a silicon oxynitride layer.

At least one first contact CNT1 may be provided to penetrate the first and second interlayer dielectric layers 110 and 120 and to have connection with at least one bit line BL. At least one second contact CNT2 may be provided to penetrate the second interlayer dielectric layer 120 and to have connection with at least one gate electrode GE. The first contact CNT1 may be disposed on the bit line BL exposed at an end of one of the first and second stack structures SS1 and SS2. The second contact CNT2 may be disposed on the gate electrode GE exposed at a top surface of one of the first and second stack structures SS1 and SS2.

In certain example embodiments, the first air gap AG1 may be interposed between the bit lines BL that are vertically stacked. Because the first air gap AG1 has a relatively low dielectric constant, it may be possible to reduce coupling capacitance due to crosstalk between the bit lines BL. When the first air gap AG1 is not present, it may be required that a thickness of the first dielectric layer ILD1 be increased to reduce capacitance between the bit lines BL. According to some example embodiments, because the bit lines BL are provided therebetween with the first air gap AG1 whose dielectric constant is low, it may be possible to relatively reduce the thickness of the first dielectric layer ILD1, and as a result to relatively decrease a height of each of the first and second stack structures SS1 and SS2.

In certain example embodiments, the second air gap AG2 may be interposed between the first and second gate electrodes GE1 and GE2. Therefore, it may be possible to reduce coupling capacitance caused by interference between the first and second gate electrodes GE1 and GE2. In conclusion, according to some example embodiments, electrical characteristics of a semiconductor device may be improved due to reduction in capacitance between neighboring conductive lines.

FIGS. 6, 8, 10, 12, 14, 16, 18, and 20 illustrate plan views showing a method of fabricating a three-dimensional semiconductor memory device according to some example embodiments of the present inventive concepts. FIGS. 7, 9, 11A, 13A, 15A, 17A, 19A, and 21A illustrate cross-sectional views taken along line A-A' of FIGS. 6, 8, 10, 12, 14, 16, 18, and 20, respectively. FIGS. 13B, 15B, 17B, 19B, and 21B illustrate cross-sectional views taken along line B-B' of FIGS. 12, 14, 16, 18, and 20, respectively. FIGS. 15C, 17C, 19C, and 21C illustrate cross-sectional views taken along line C-C' of FIGS. 14, 16, 18, and 20, respectively.

Figure 6:
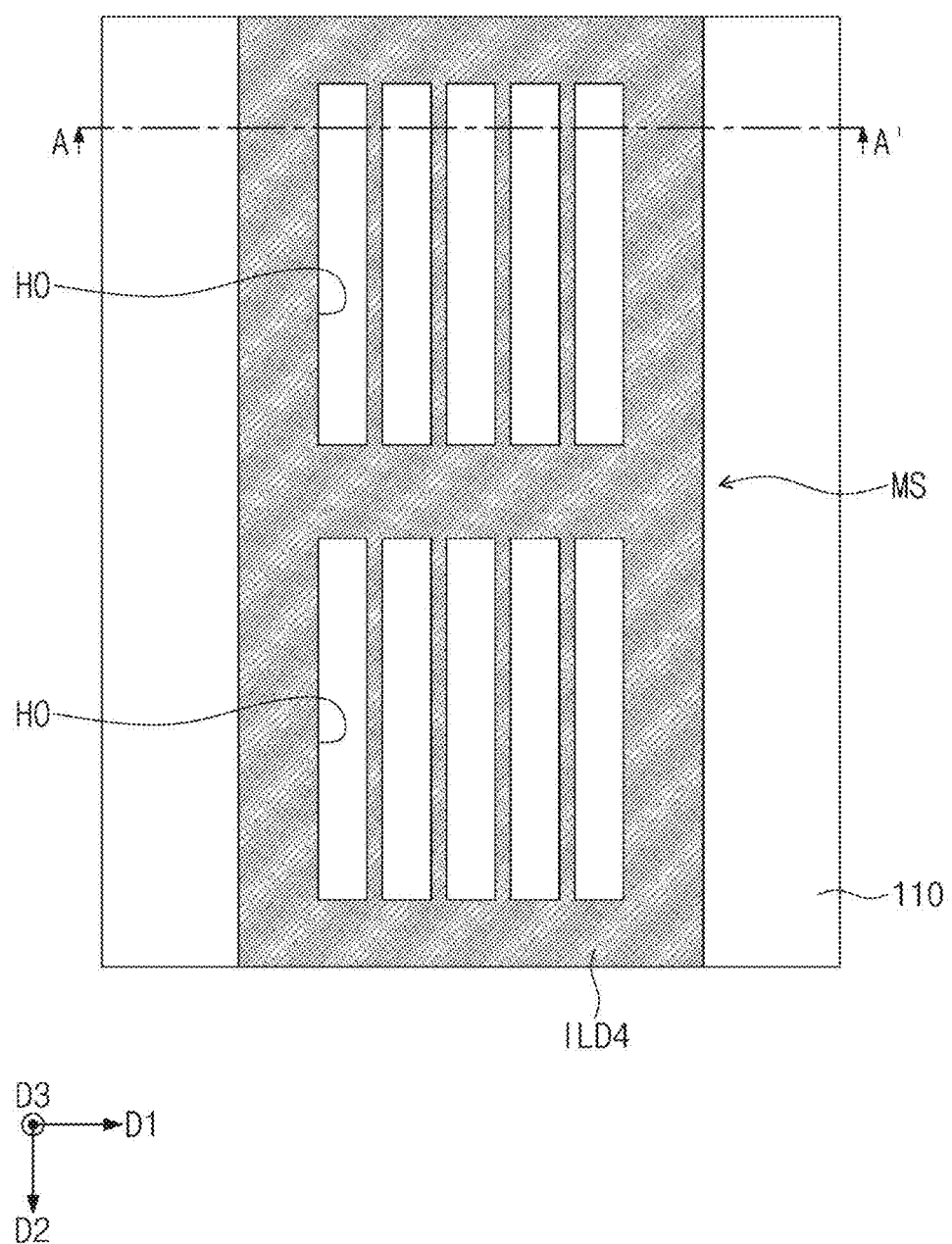
FIGS. 6, 8, 10, 12, 14, 16, 18, and 20 illustrate plan views showing a method of fabricating a three-dimensional semiconductor memory device according to some example embodiments of the present inventive concepts.
Figure 7:
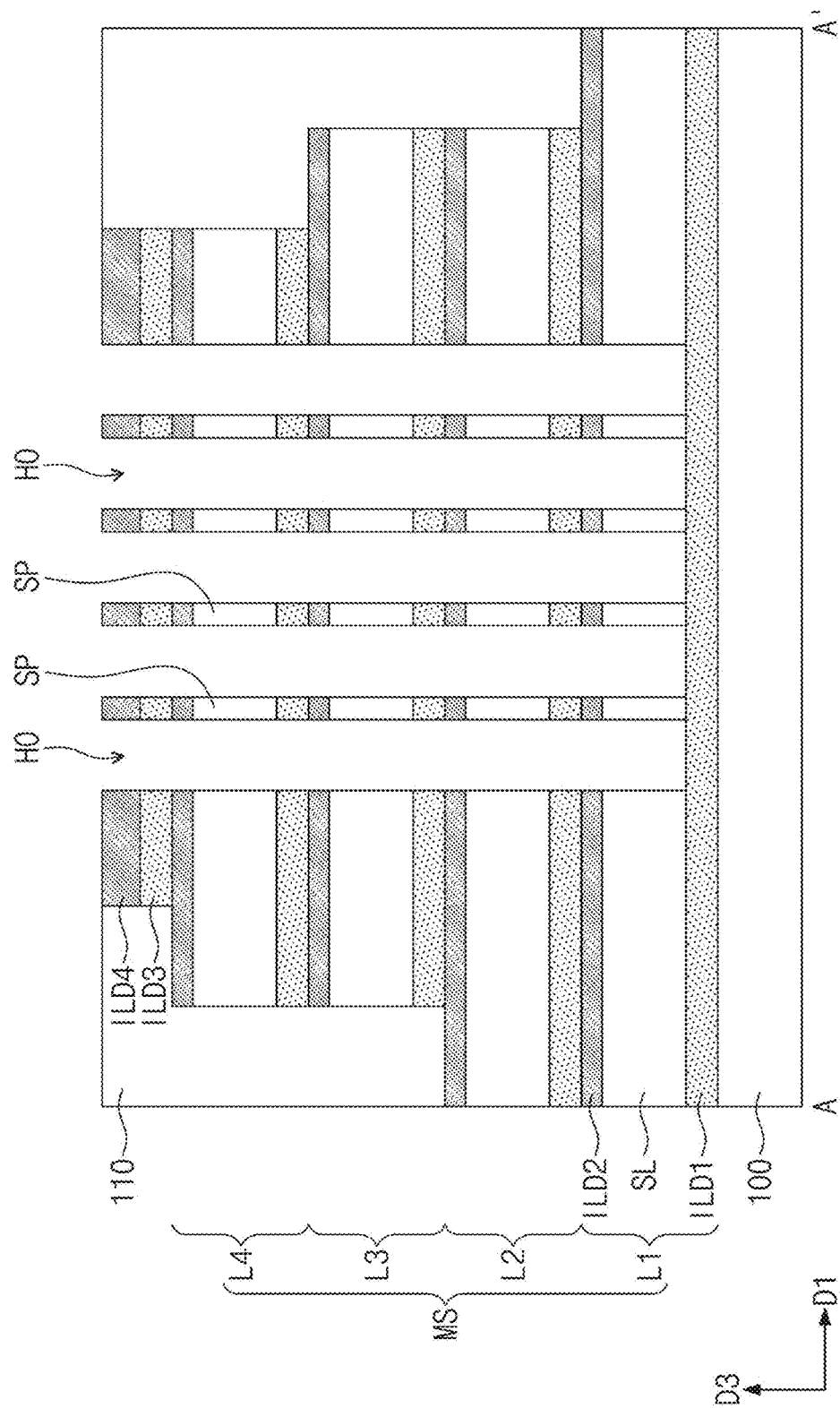
FIGS. 7, 9, 11A, 13A, 15A, 17A, 19A, and 21A illustrate cross-sectional views taken along line A-A' of FIGS. 6, 8, 10, 12, 14, 16, 18, and 20, respectively.

Referring to FIGS. 6 and 7, a mold structure MS may be formed on a substrate 100. The formation of the mold structure MS may include forming first, second, third, and fourth layers L1, L2, L3, and L4 that are sequentially stacked. The mold structure MS may be formed to have stepwise structures at its opposite ends.

Each of the first, second, third, and fourth layers L1, L2, L3, and L4 may include a first dielectric layer ILD1, a semiconductor layer SL, and a second dielectric layer ILD2. The first dielectric layer ILD1, the semiconductor layer SL, and the second dielectric layer ILD2 may be sequentially formed. The semiconductor layer SL may include a semiconductor material, such as silicon, germanium, silicon-germanium, or indium gallium zinc oxide (IGZO). The first and second dielectric layers ILD1 and ILD2 may include different dielectric materials from each other. One of the first and second dielectric layers ILD1 and ILD2 may have an etch selectivity with respect to the other of the first and second dielectric layers ILD1 and ILD2. The first and second dielectric layers ILD1 and ILD2 may independently include a silicon oxide layer, a silicon nitride layer, a silicon oxynitride layer, a carbon-containing silicon oxide layer, a carbon-containing silicon nitride layer, or a carbon-containing silicon oxynitride layer. For example, the first dielectric layer ILD1 may be formed of a carbon-containing silicon oxide layer (e.g., SiOC), and the second dielectric layer ILD2 may be formed of a silicon nitride layer (e.g., SiN).

A third dielectric layer ILD3 and a fourth dielectric layer ILD4 may be formed on the mold structure MS. One of the third and fourth dielectric layers ILD3 and ILD4 may have an etch selectivity with respect to the other of the third and fourth dielectric layers ILD3 and ILD4. The third dielectric layer ILD3 may be formed of a carbon-containing silicon oxide layer (e.g., SiOC), and the fourth dielectric layer ILD4 may be formed of a silicon nitride layer (e.g., SiN). A first interlayer dielectric layer 110 may be formed to cover the mold structure MS. The first interlayer dielectric layer 110 may have a top surface coplanar with that of the fourth dielectric layer ILD4. The first interlayer dielectric layer 110 may be formed using one or more of a silicon oxide layer, a silicon nitride layer, and a silicon oxynitride layer.

The mold structure MS may be patterned to form holes HO penetrating the mold structure MS. The holes HO may not penetrate the first dielectric layer ILD1 at the bottom of the mold structure MS. The first dielectric layer ILD1 at the bottom of the mold structure MS may not allow the holes HO to expose a top surface of the substrate 100.

Each of the holes HO may have a linear or bar shape extending in a second direction D2. The holes HO may be arranged spaced apart from each other along a first direction D1. Each of the semiconductor layers SL may have semiconductor patterns SP defined by the holes HO. For example, the semiconductor pattern SP may be defined by a pair of neighboring holes HO.

Figure 8:
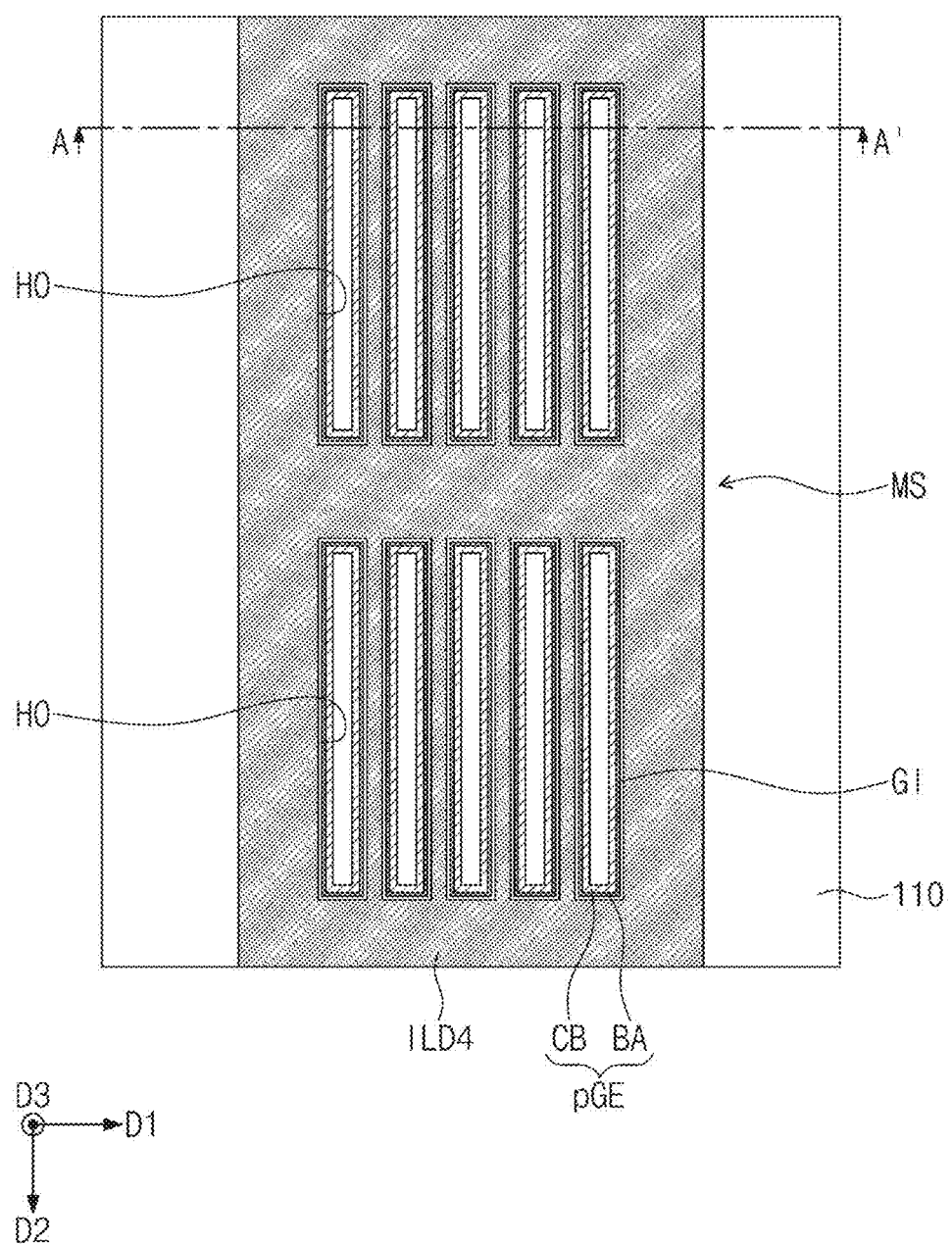
Figure 9:
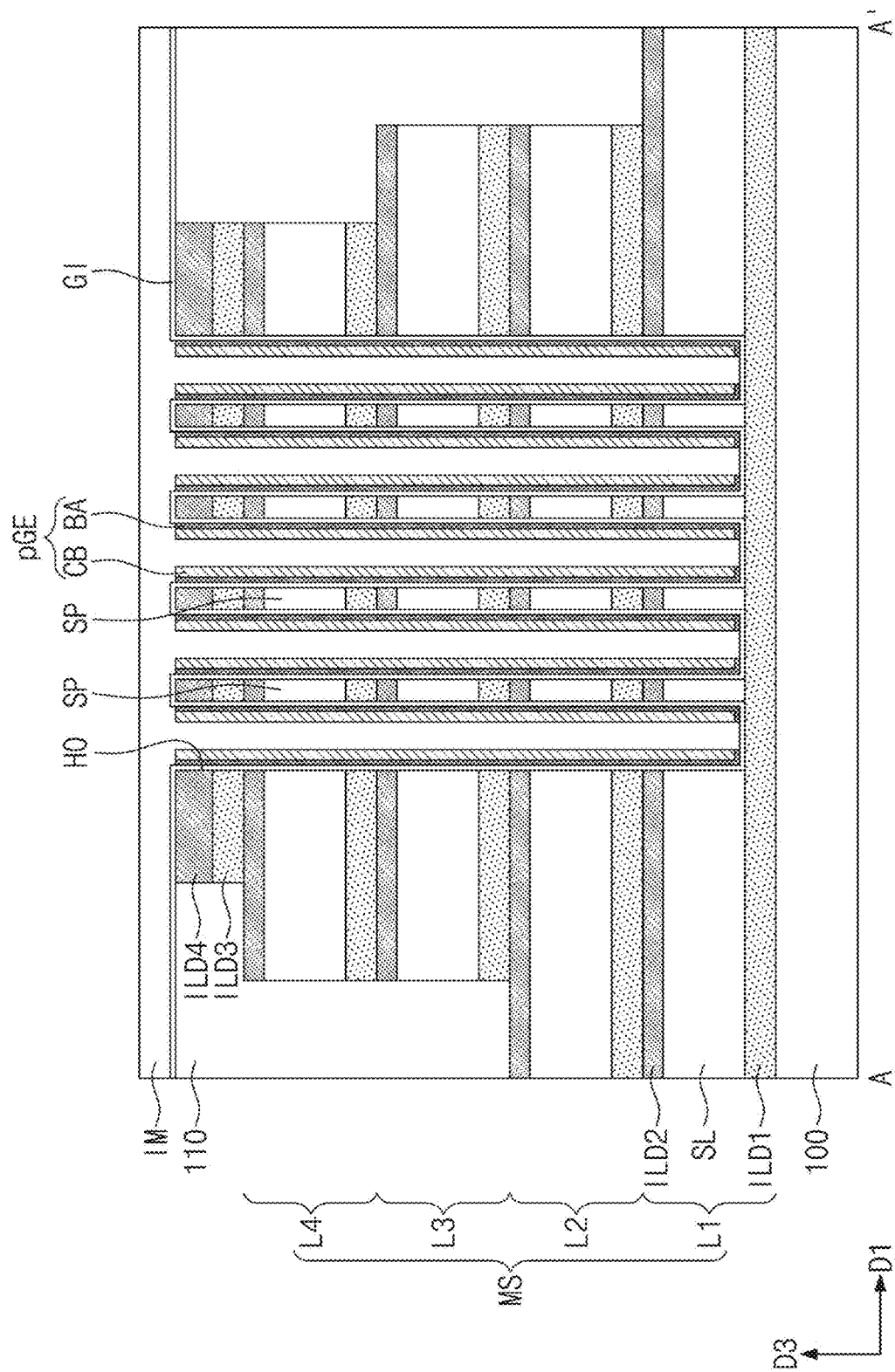

Referring to FIGS. 8 and 9, a gate dielectric layer GI may be conformally formed on an inner sidewall, which is exposed to the holes HO, of the mold structure MS. For example, a high-k dielectric material may be used to conformally form the gate dielectric layer GI.

Preliminary gate electrodes pGE may be formed to partially fill the holes HO. The preliminary gate electrodes pGE may be formed on the inner sidewall, which is exposed to the holes HO, of the mold structure MS. The formation of the preliminary gate electrodes pGE may include conformally forming a barrier layer on the gate dielectric layer GI, conformally forming a conductive layer on the barrier layer, and anisotropically etching the barrier layer and the conductive layer to respectively form a barrier pattern BA and a conductive body CB. The barrier layer may be formed using conductive metal nitride (titanium nitride, tantalum nitride, etc.), and the conductive layer may be formed using metal (tungsten, titanium, tantalum, etc.).

After the preliminary gate electrodes pGE are formed, a dielectric material IM may be deposited. The dielectric material IM may be formed to completely fill the holes HO. The dielectric material IM may include one or more of silicon oxide, silicon nitride, and silicon oxynitride.

Figure 10:
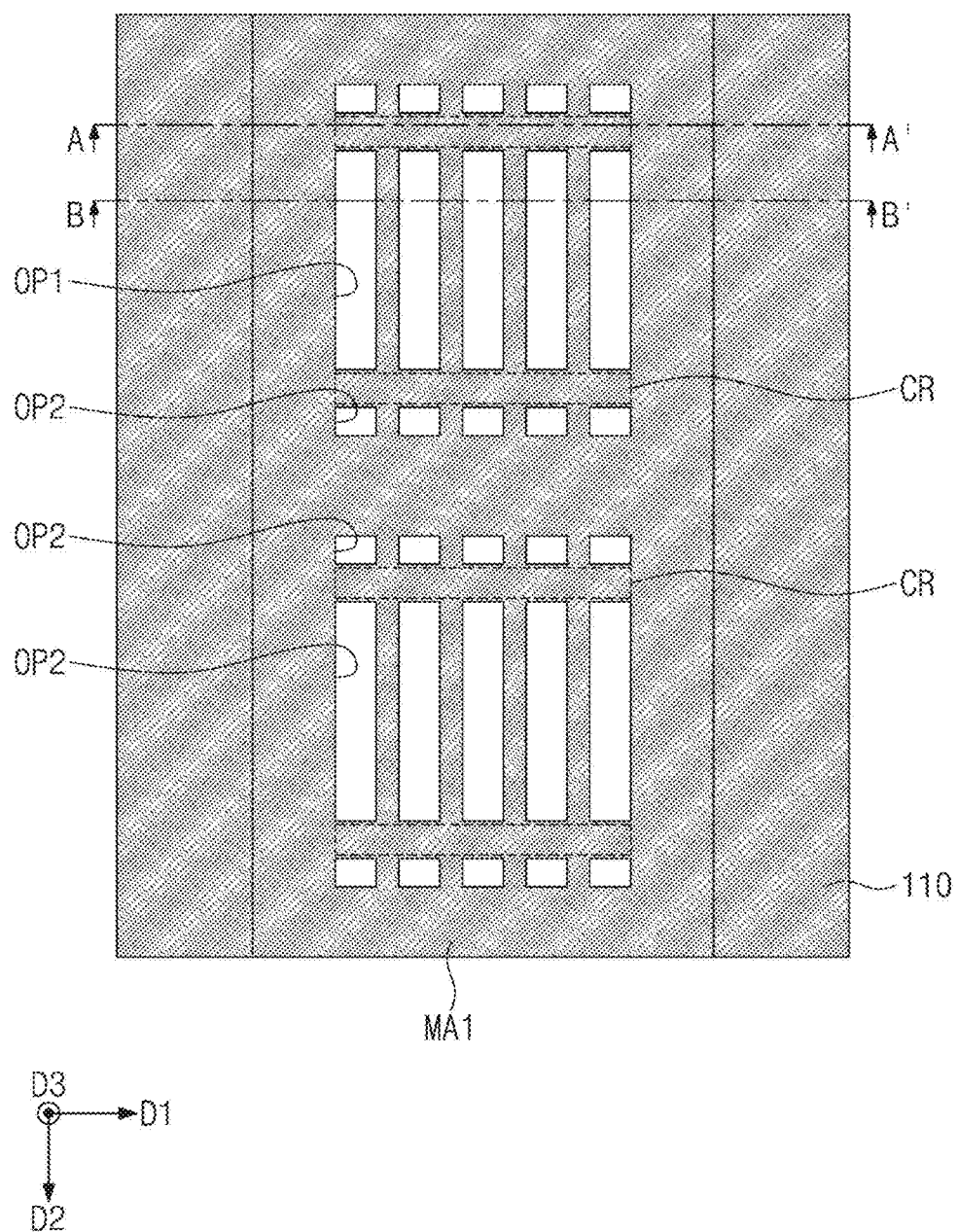
Figure 11A:
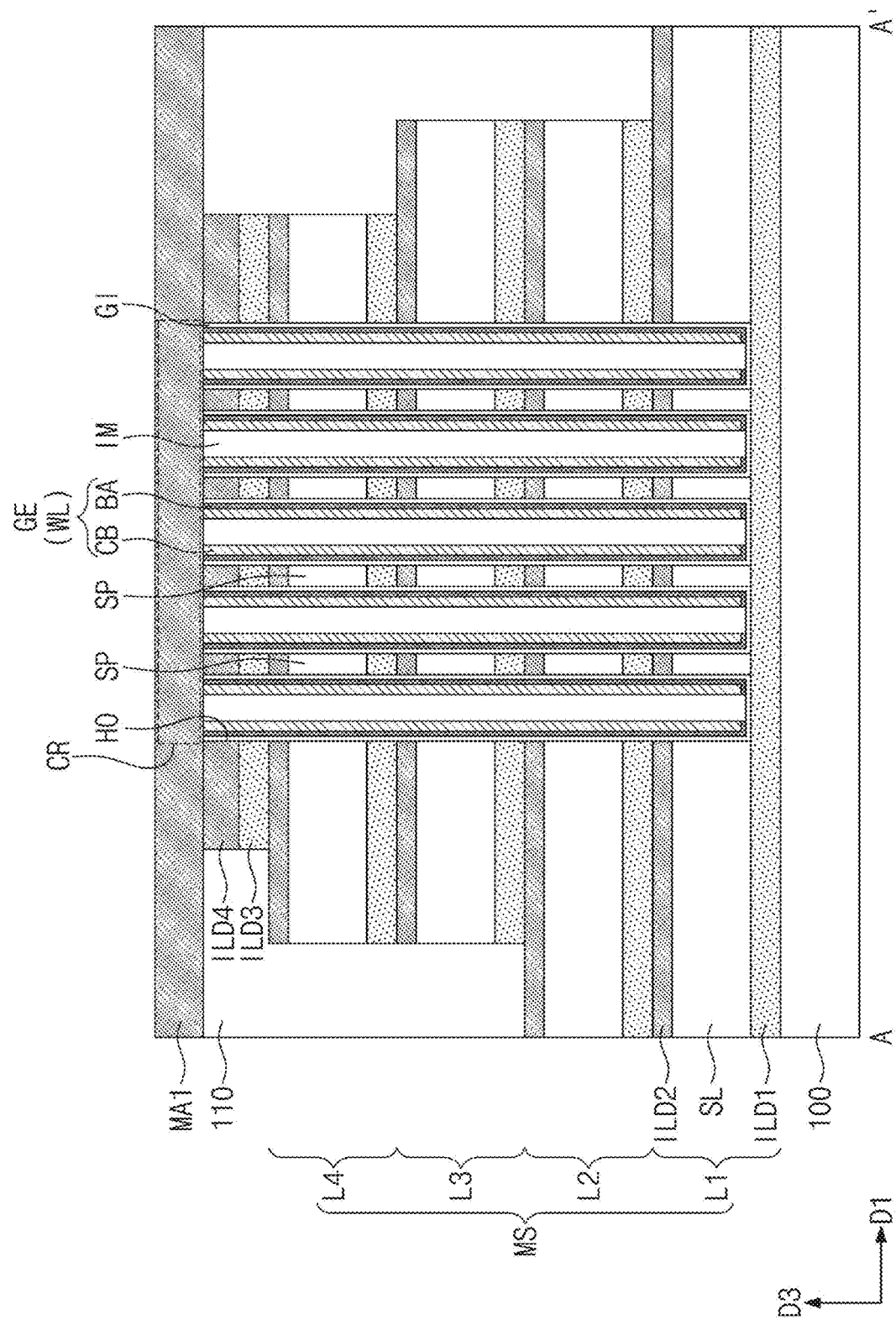
Figure 11B:
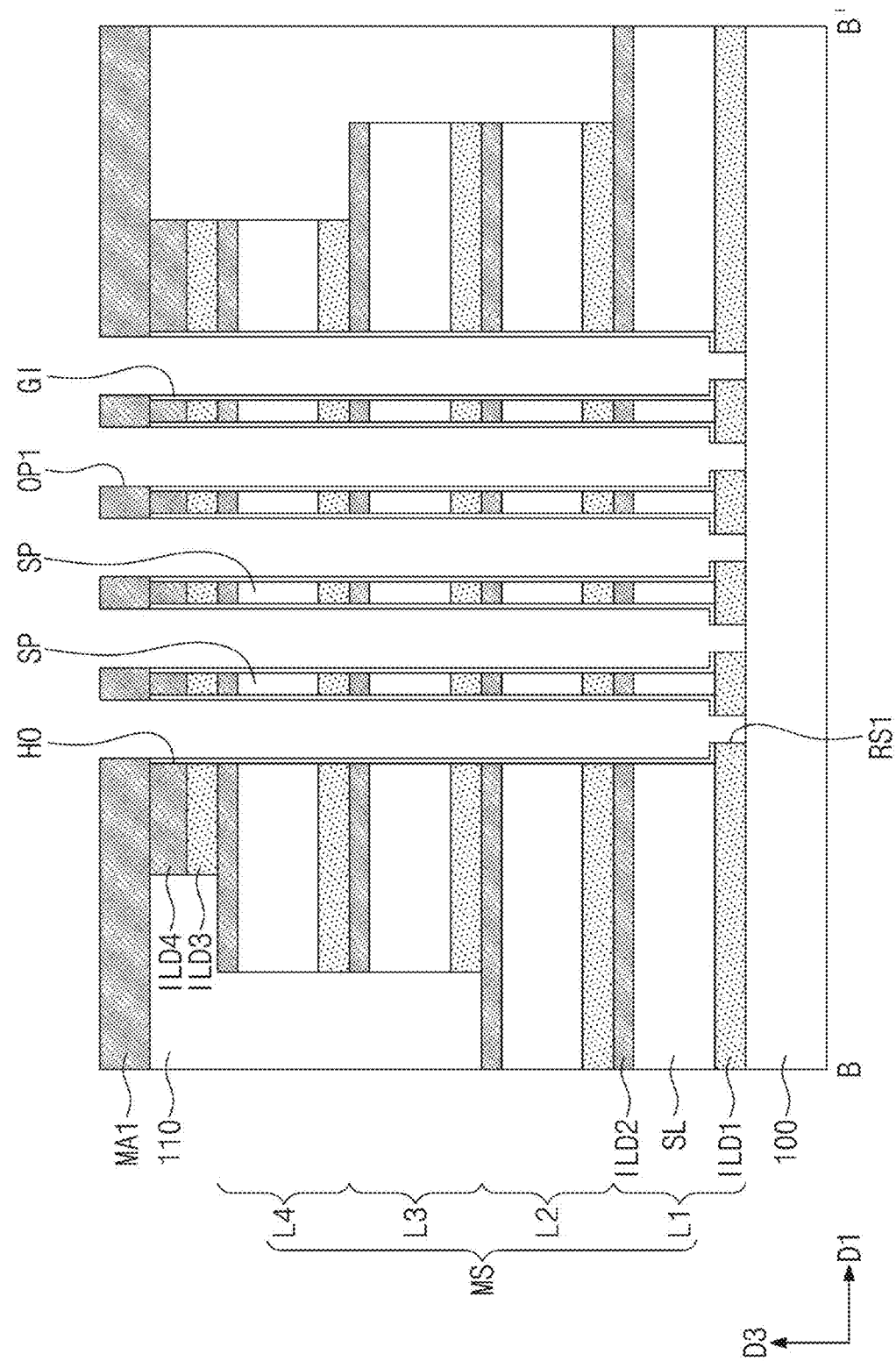
FIGS. 11B, 15B, 17B, 19B, and 21B illustrate cross-sectional views taken along line B-B' of FIGS. 12, 14, 16, 18, and 20, respectively.

Referring to FIGS. 10, 11A, and 11B, a planarization process may be performed on the dielectric material IM and the gate dielectric layer GI until the top surfaces of the first interlayer dielectric layer 110 and the fourth dielectric layer ILD4 are exposed.

A first mask pattern MA1 including first openings OP1 and second openings OP2 may be formed on the first interlayer dielectric layer 110 and the fourth dielectric layer ILD4. When viewed in plan, the first openings OP1 and the second openings OP2 may overlap the holes HO. Each of the first openings OP1 may have a linear or bar shape extending in the second direction D2. The first openings OP1 may be arranged spaced apart from each other along the first direction D1. The second openings OP2 may be arranged spaced apart from each other along the first direction D1. Each of the second openings OP2 may be spaced apart from its adjacent first opening OP1 in the second direction D2 or in an opposite direction to the second direction D2.

The first mask pattern MA1 may include closed regions CR. Each of the closed regions CR may be a region between the first opening OP1 and the second opening OP2 that are adjacent to each other. Each of the closed regions CR may extend in the first direction D1. The closed regions CR may define positions where gate electrodes GE are formed as discussed below.

A removal process may be performed on the dielectric material IM exposed to the first and second openings OP1 and OP2. The dielectric material IM may be removed by an anisotropic etching process. Accordingly, the dielectric material IM may not be completely removed but may remain below the closed portions CR of the first mask pattern MA1. During the anisotropic etching process for removing the dielectric material IM, the anisotropic etching process may etch the first dielectric layer ILD1, which is exposed to the holes HO, provided at the bottom of the mold structure MS. Therefore, first recesses RS1 may be formed to partially expose the top surface of the substrate 100.

The preliminary gate electrodes pGE exposed to the first and second openings OP1 and OP2 may be removed to form gate electrodes GE. The preliminary gate electrodes pGE may be removed by an anisotropic etching process. Accordingly, the preliminary gate electrodes pGE may not be completely removed but may remain below the closed portions CR of the first mask pattern MA1. The remaining preliminary gate electrodes pGE may constitute the gate electrodes GE. The anisotropic etching process may separate one preliminary gate electrode pGE in one hole HO into four gate electrodes GE that are spaced apart from each other. The gate electrodes GE may have linear or bar shapes extending in a vertical direction (e.g., a third direction D3). The remaining dielectric material IM may be interposed between a pair of neighboring gate electrodes GE.

Figure 12:
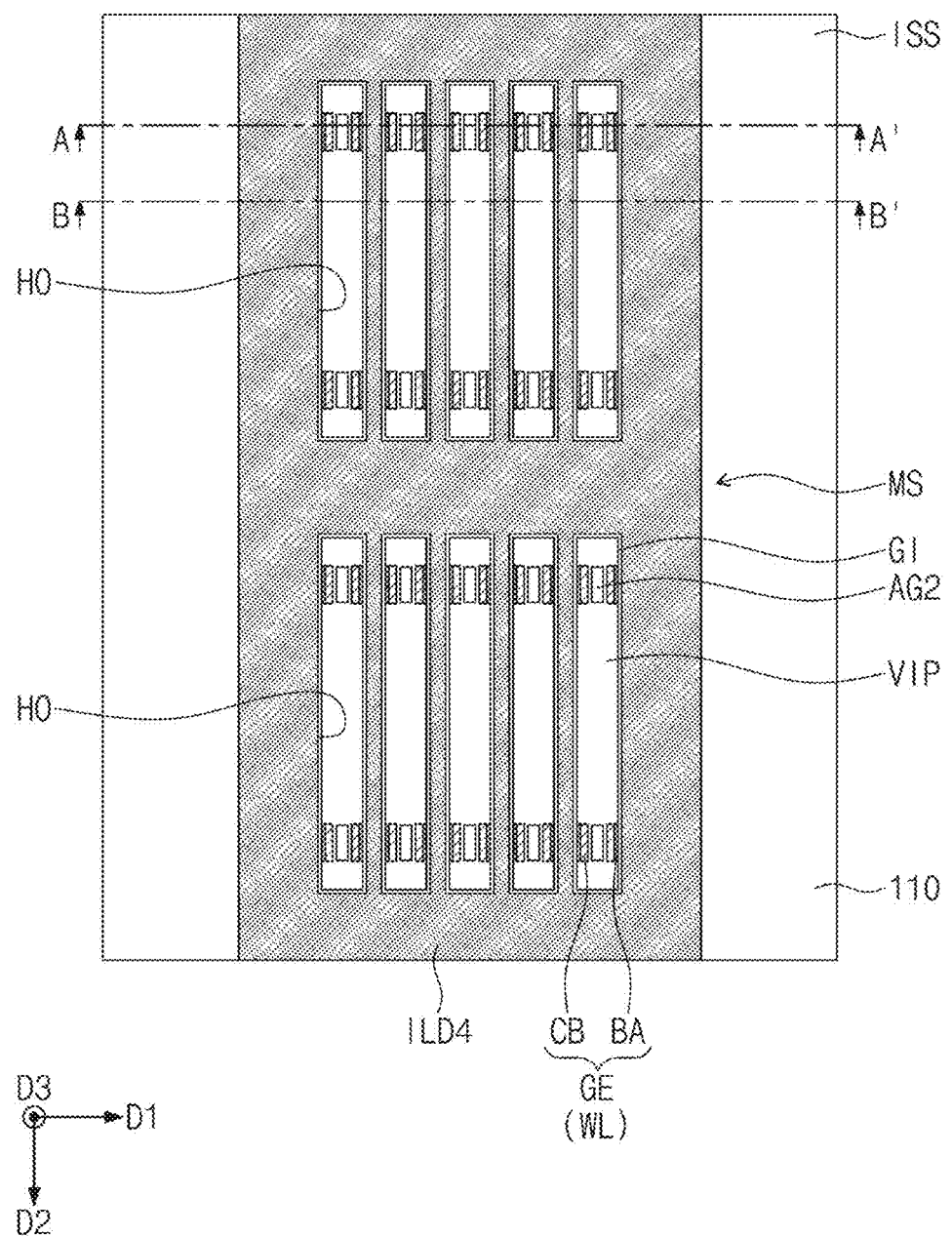
Figure 13A:
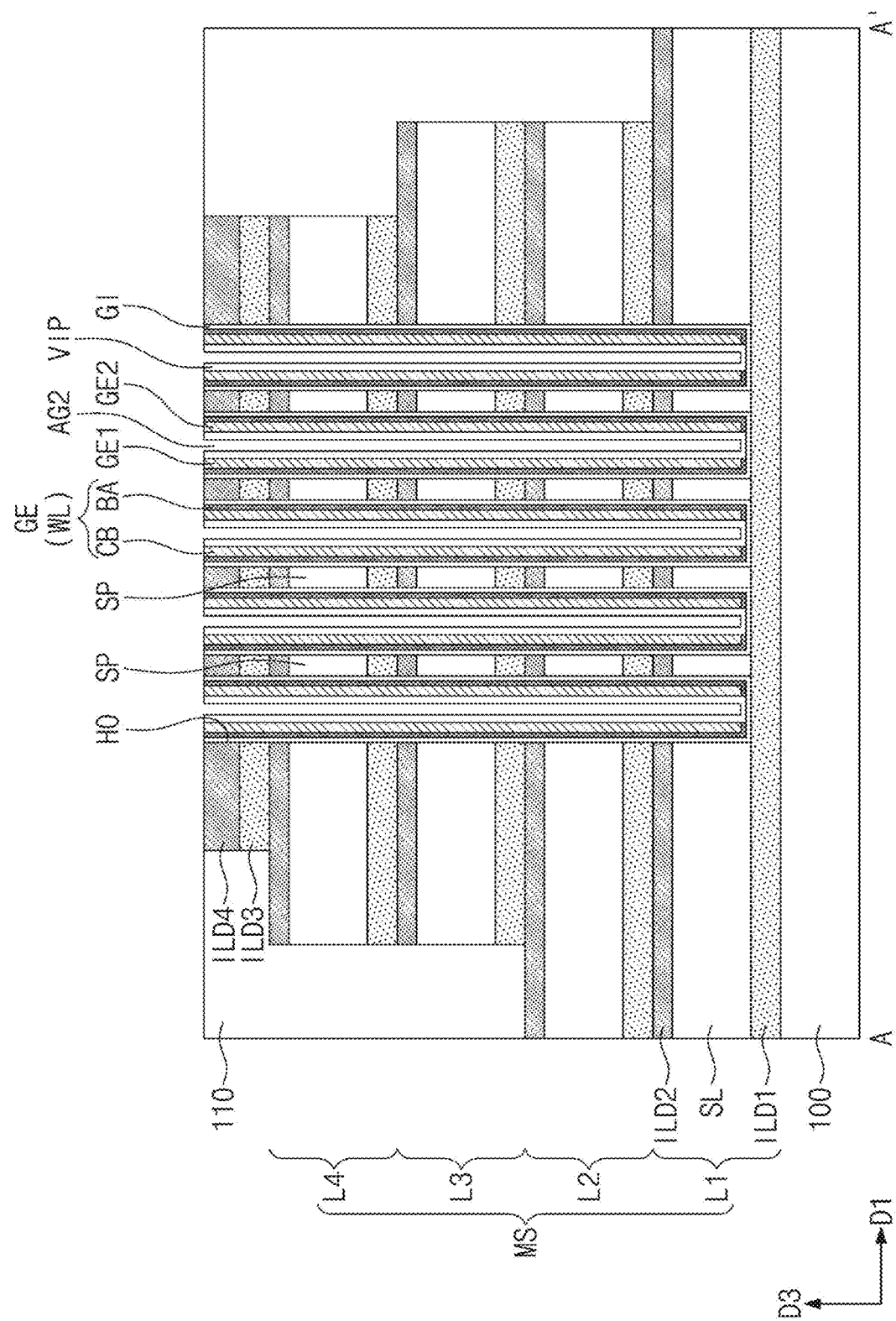
Figure 13B:
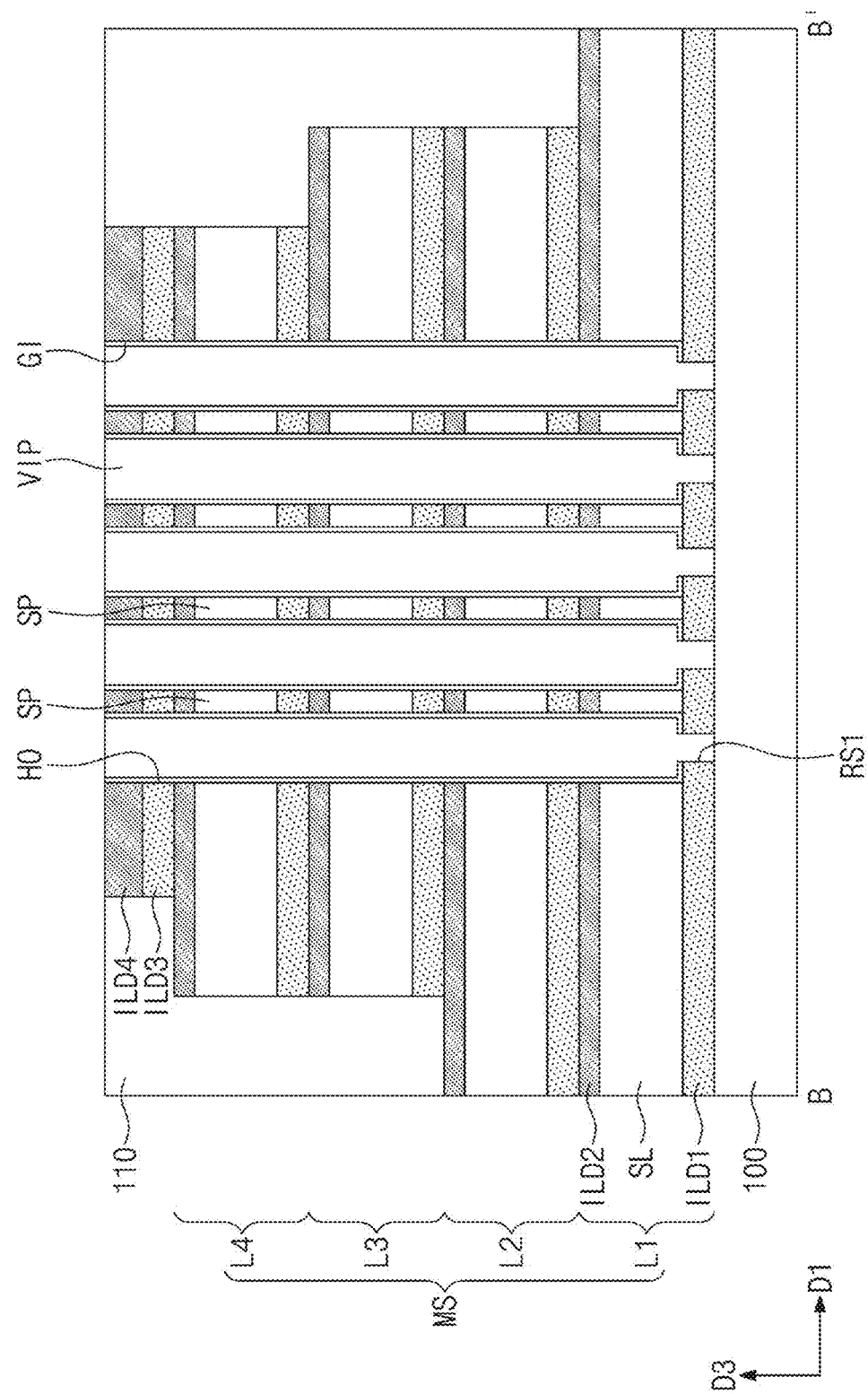
Figure 14:
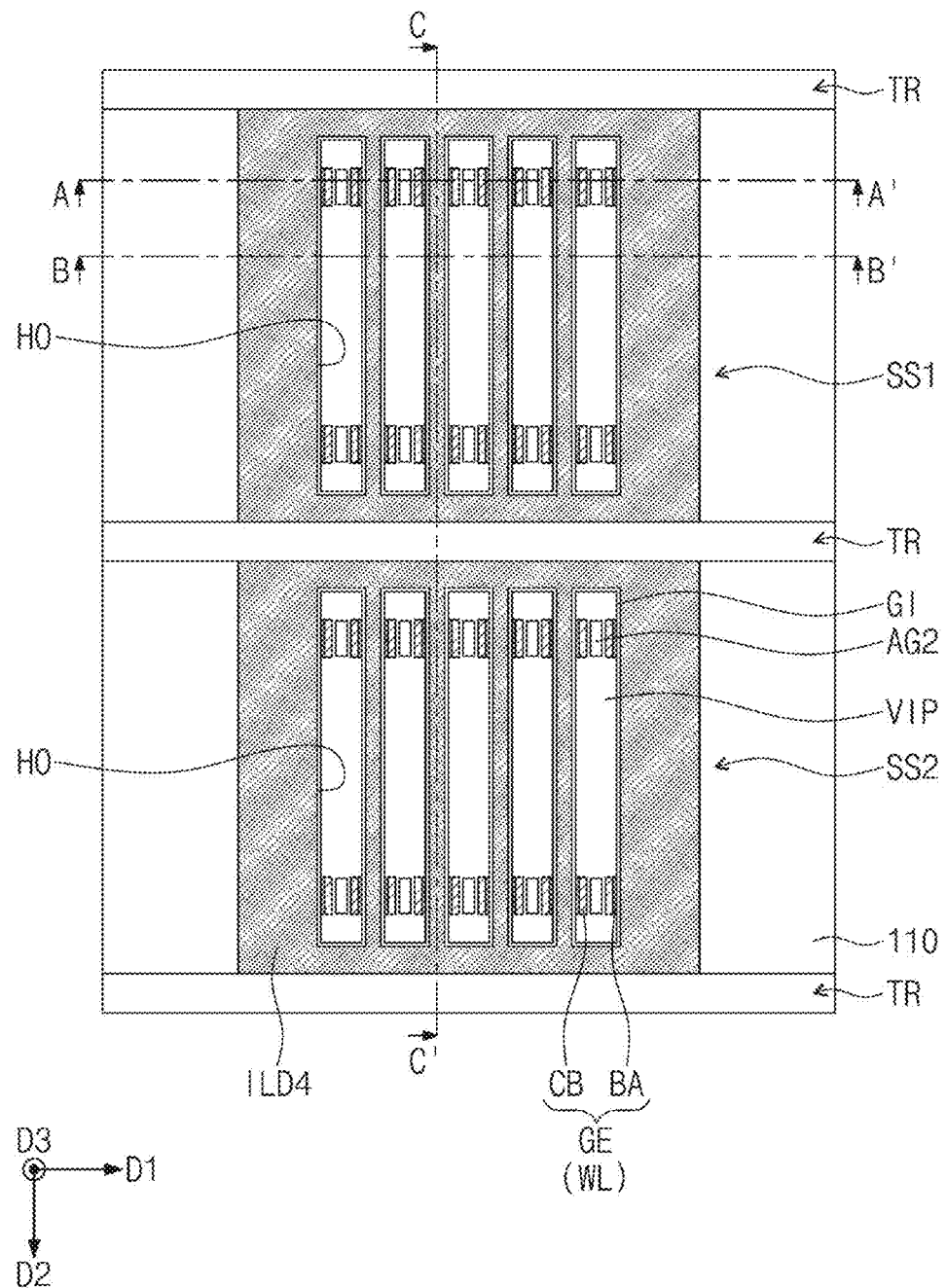
Figure 15A:
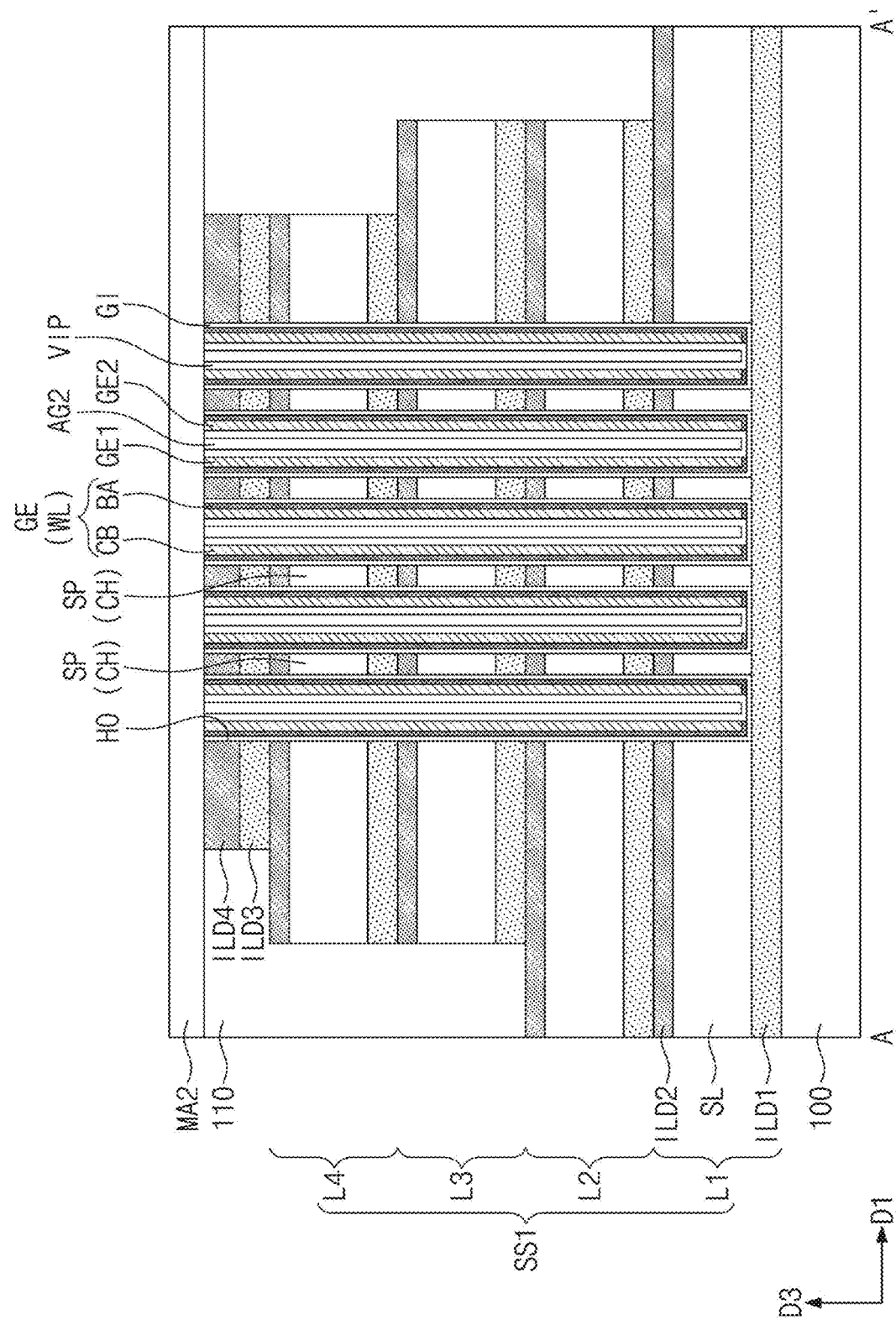
Figure 15B:
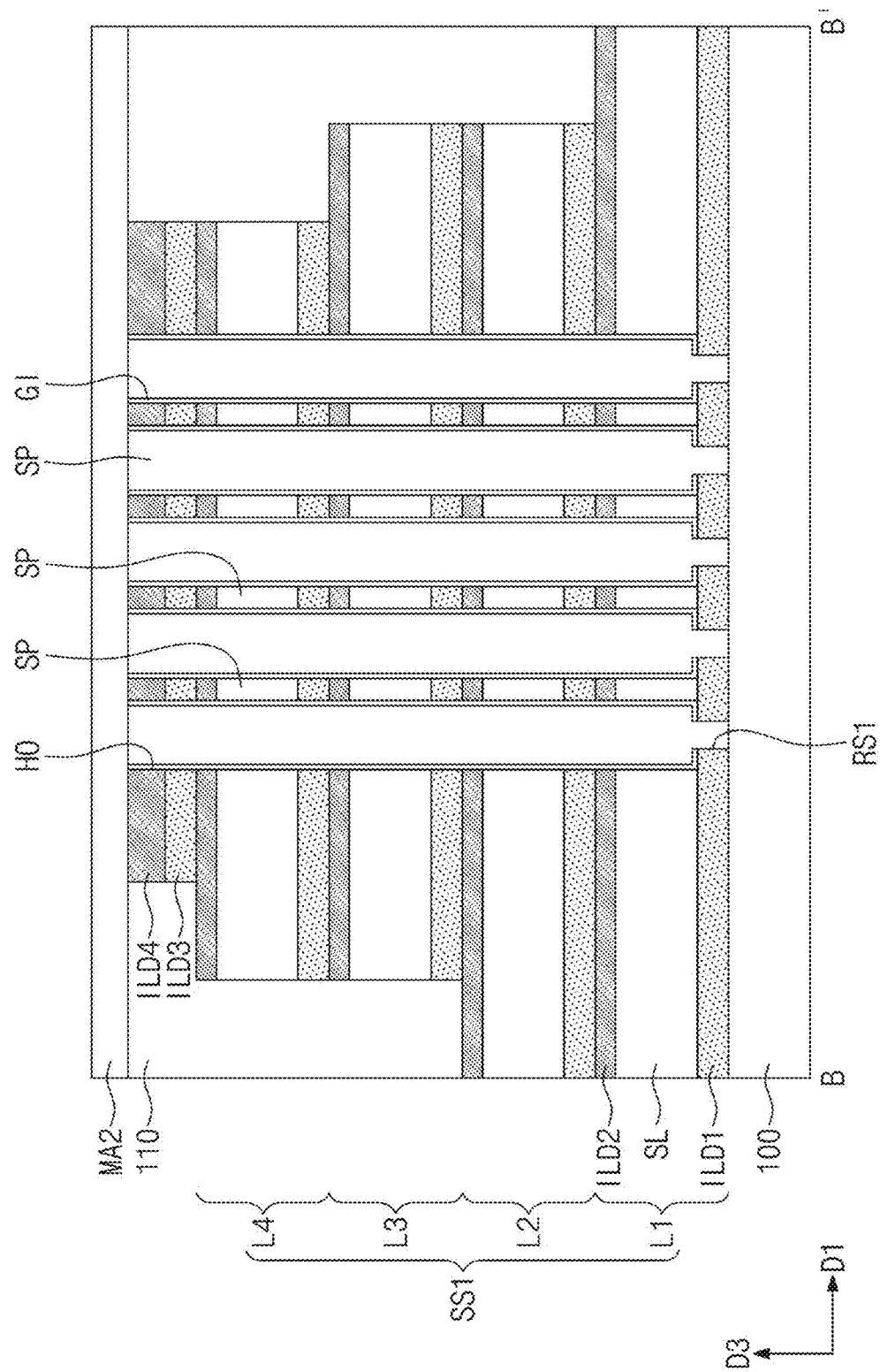
Figure 15C:
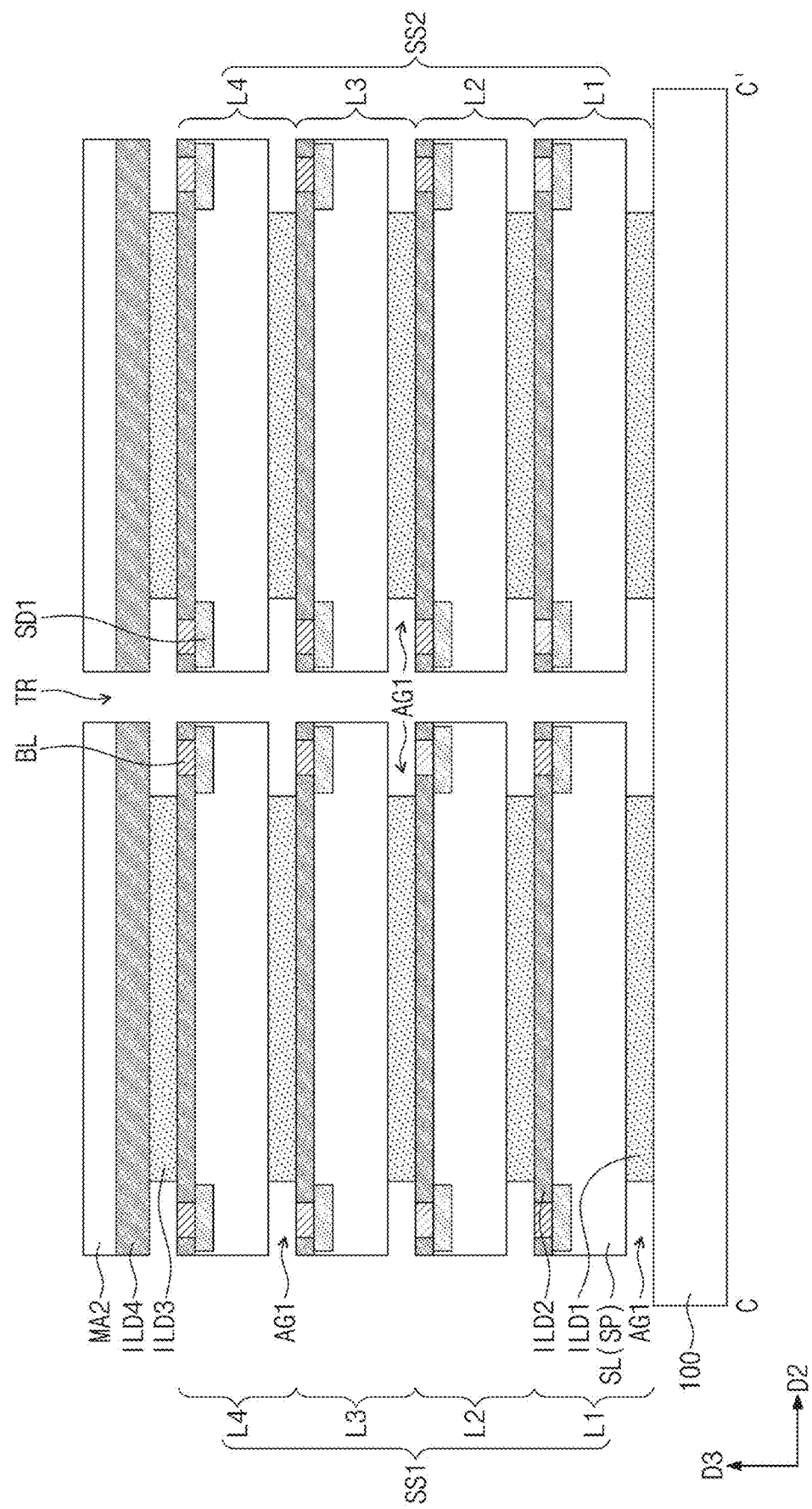
FIGS. 15C, 17C, 19C, and 21C illustrate cross-sectional views taken along line C-C' of FIGS. 14, 16, 18, and 20, respectively.
Figure 16:
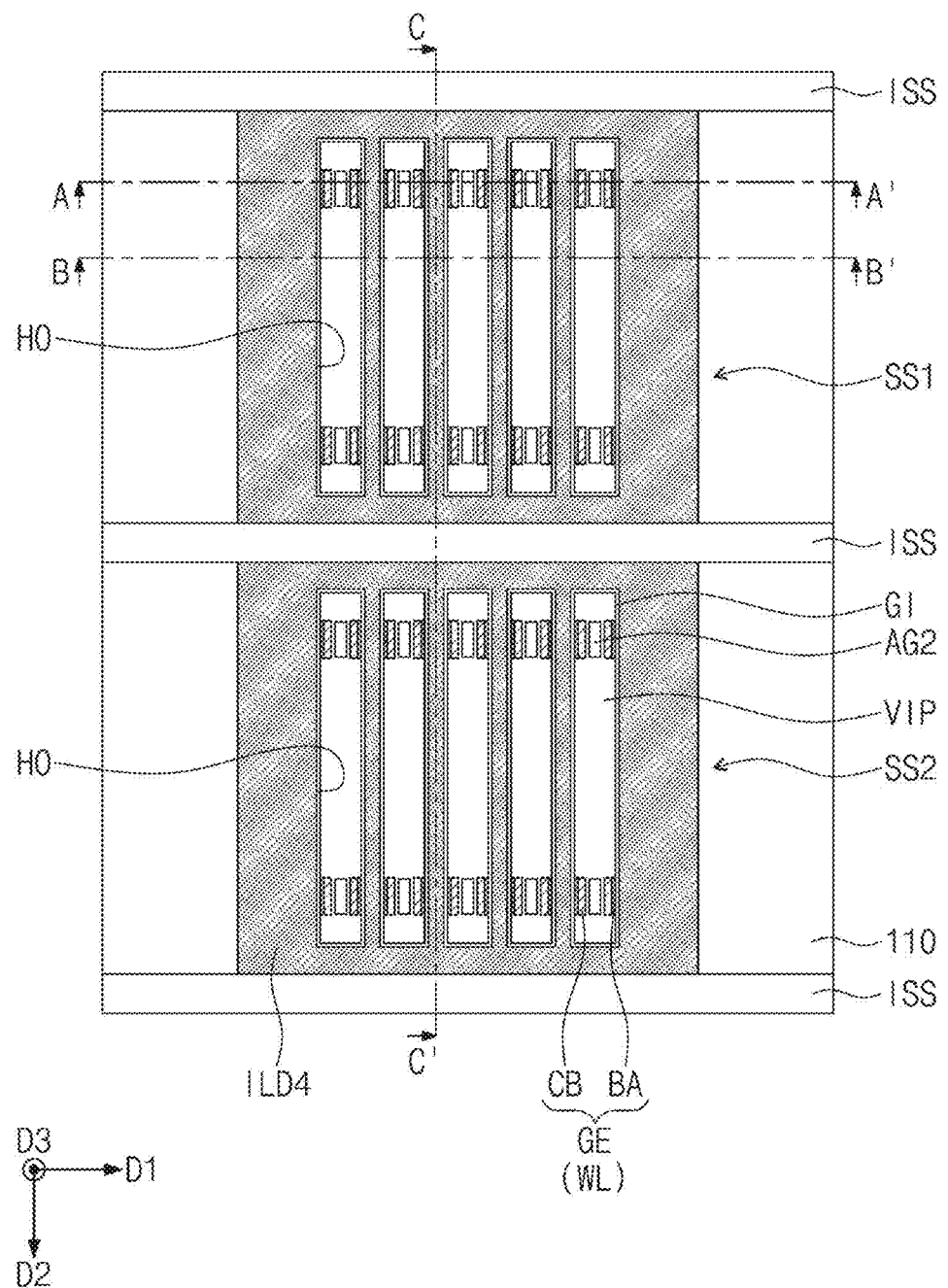
Figure 17A:
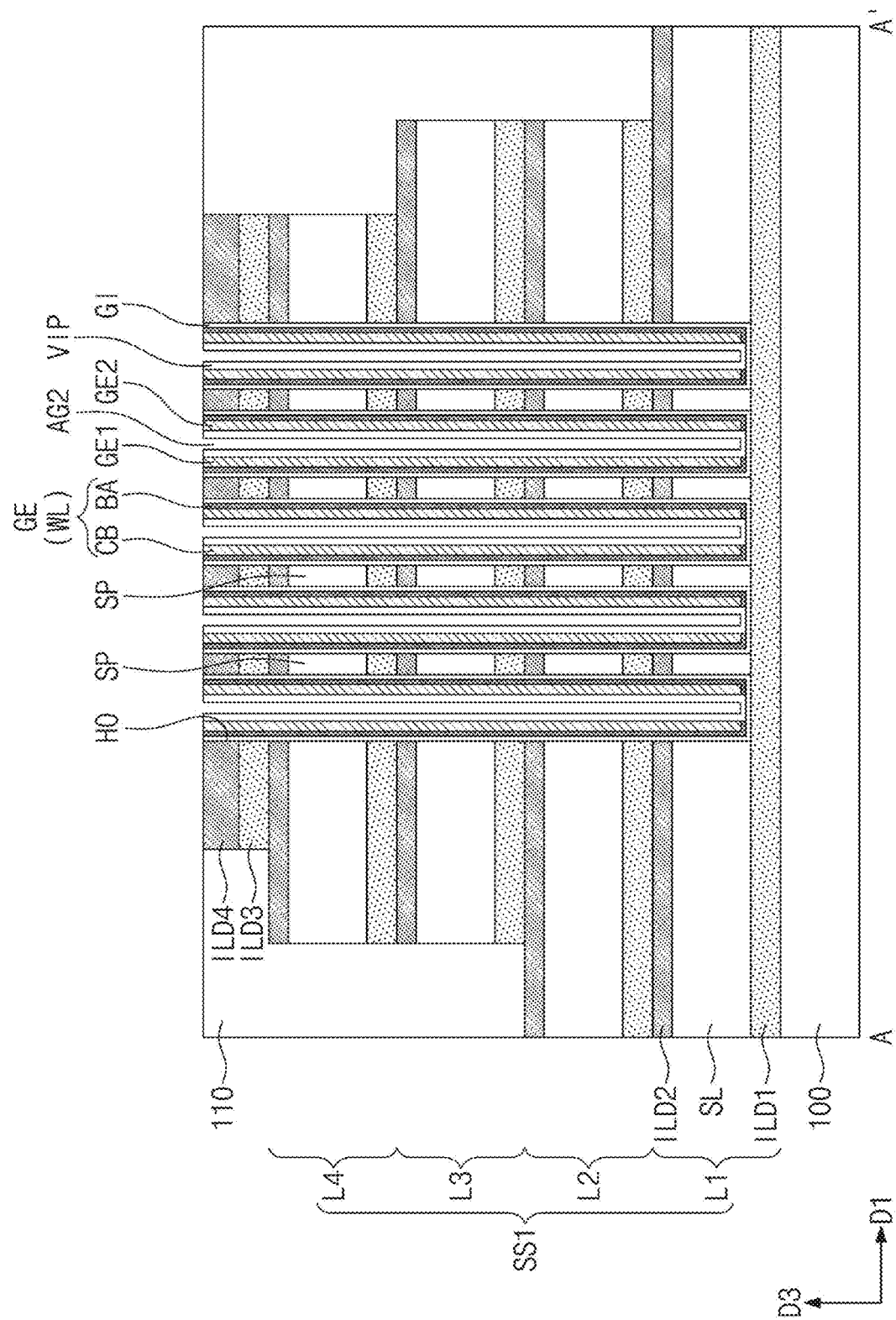
Figure 17B:
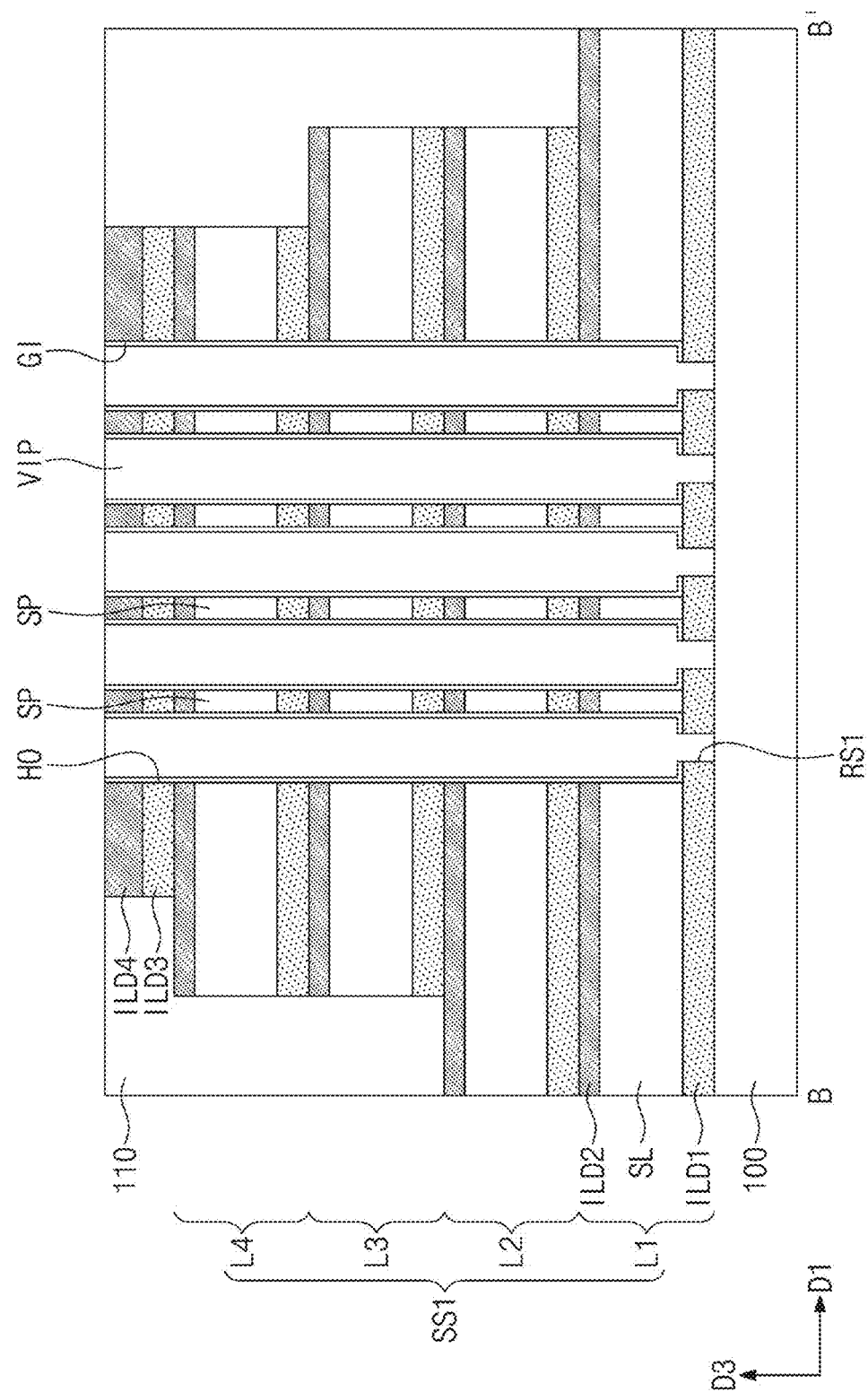
Figure 17C:
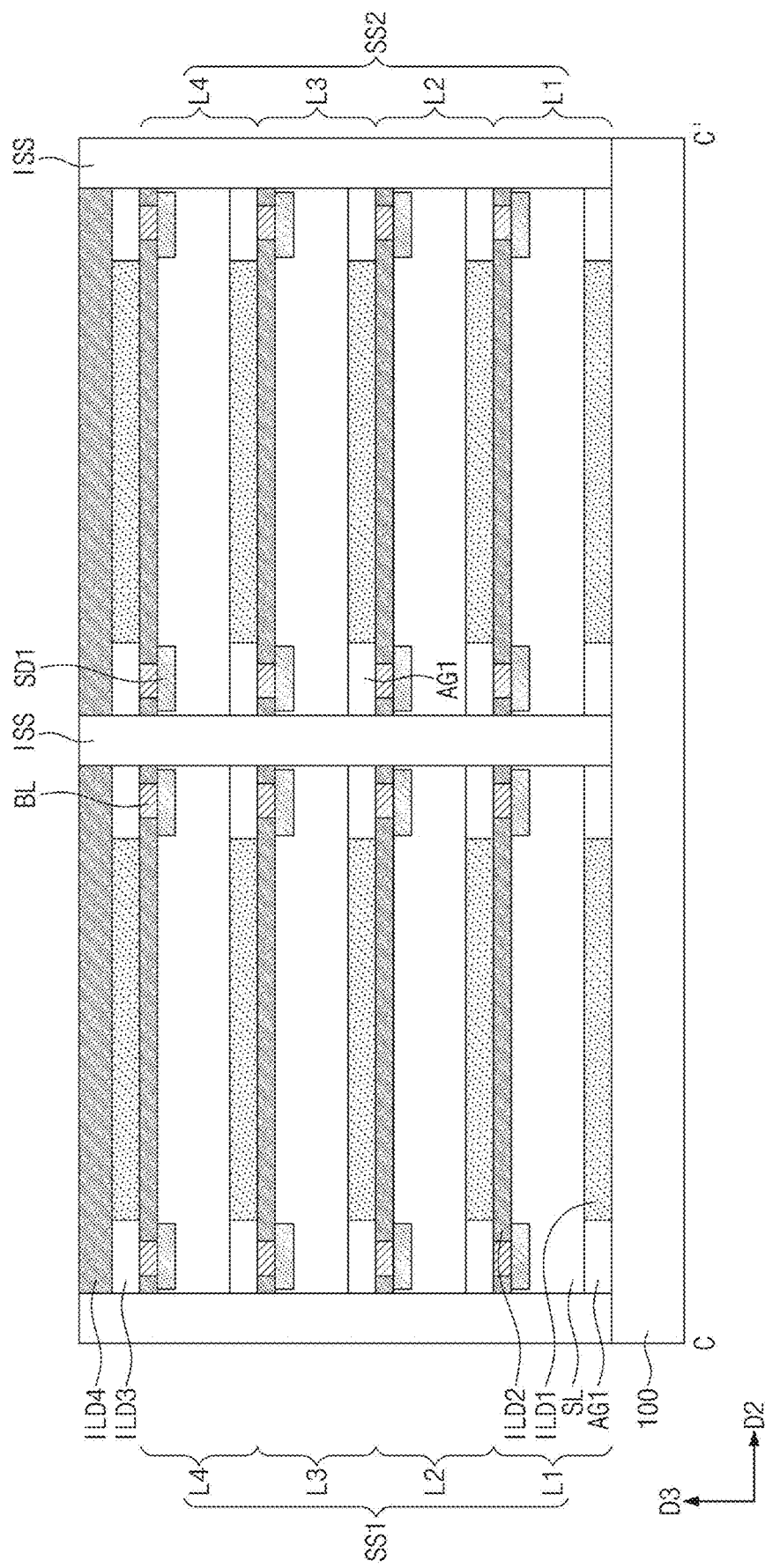
Figure 18:
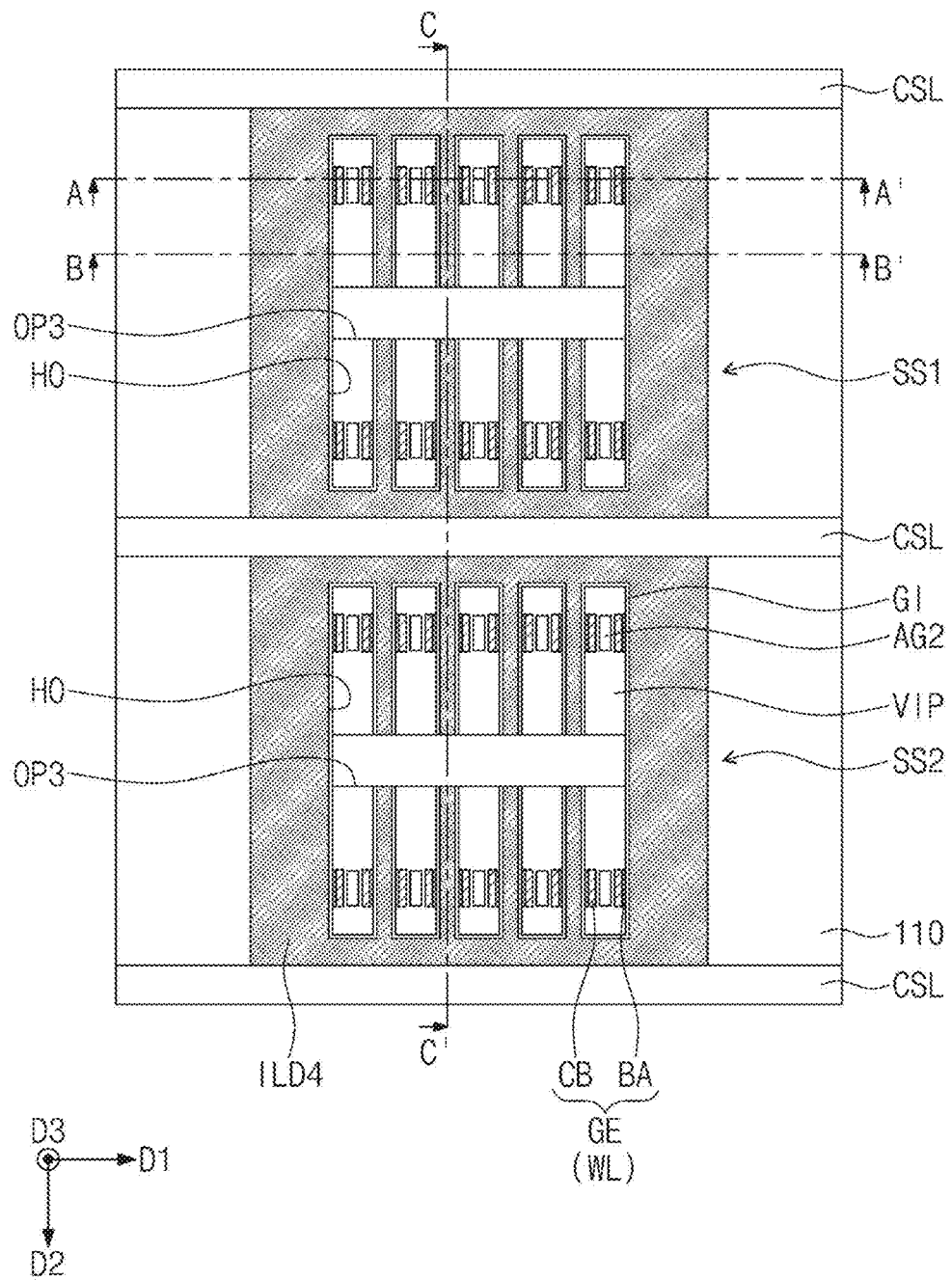
Figure 19A:
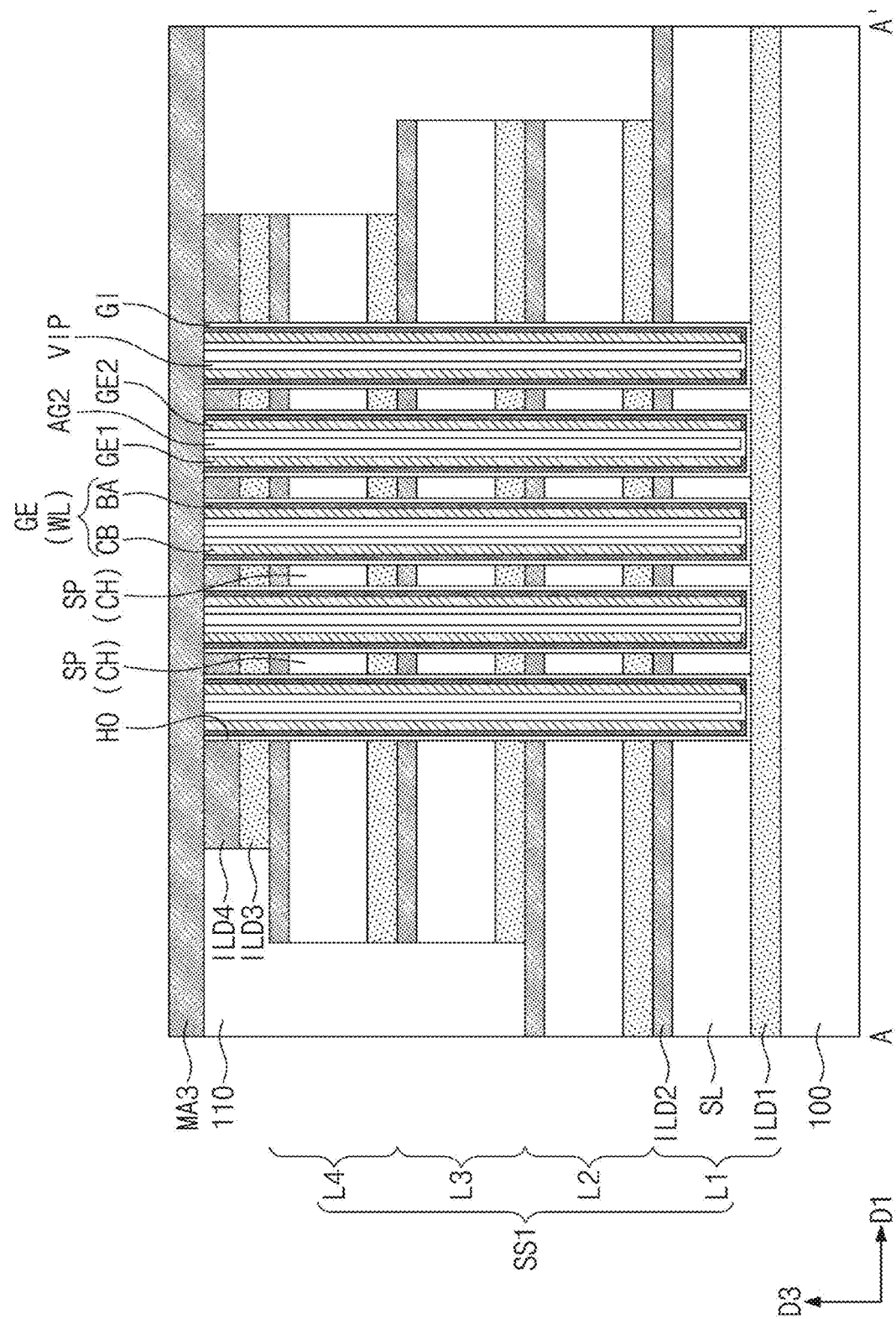
Figure 19B:
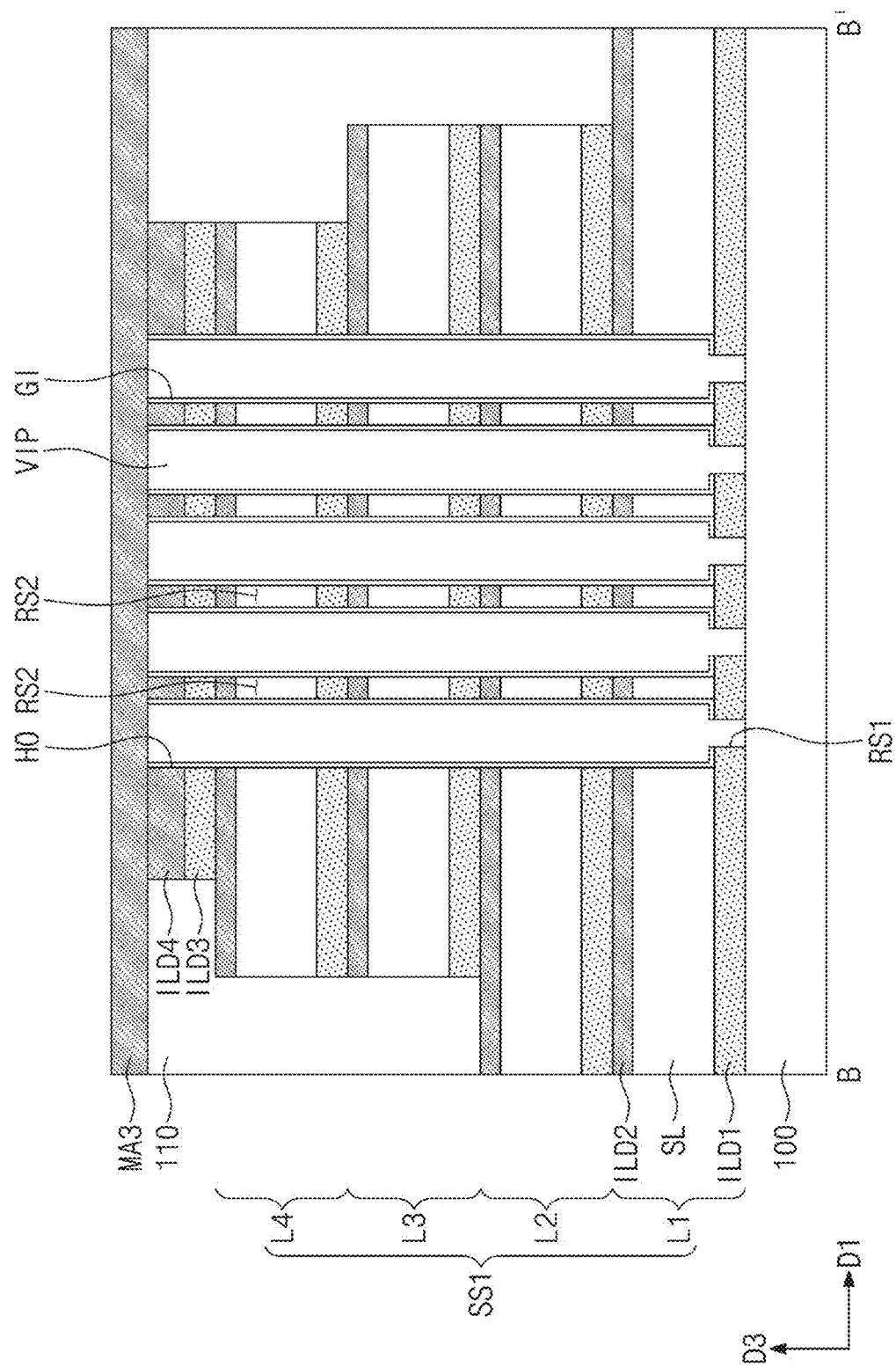
Figure 19C:
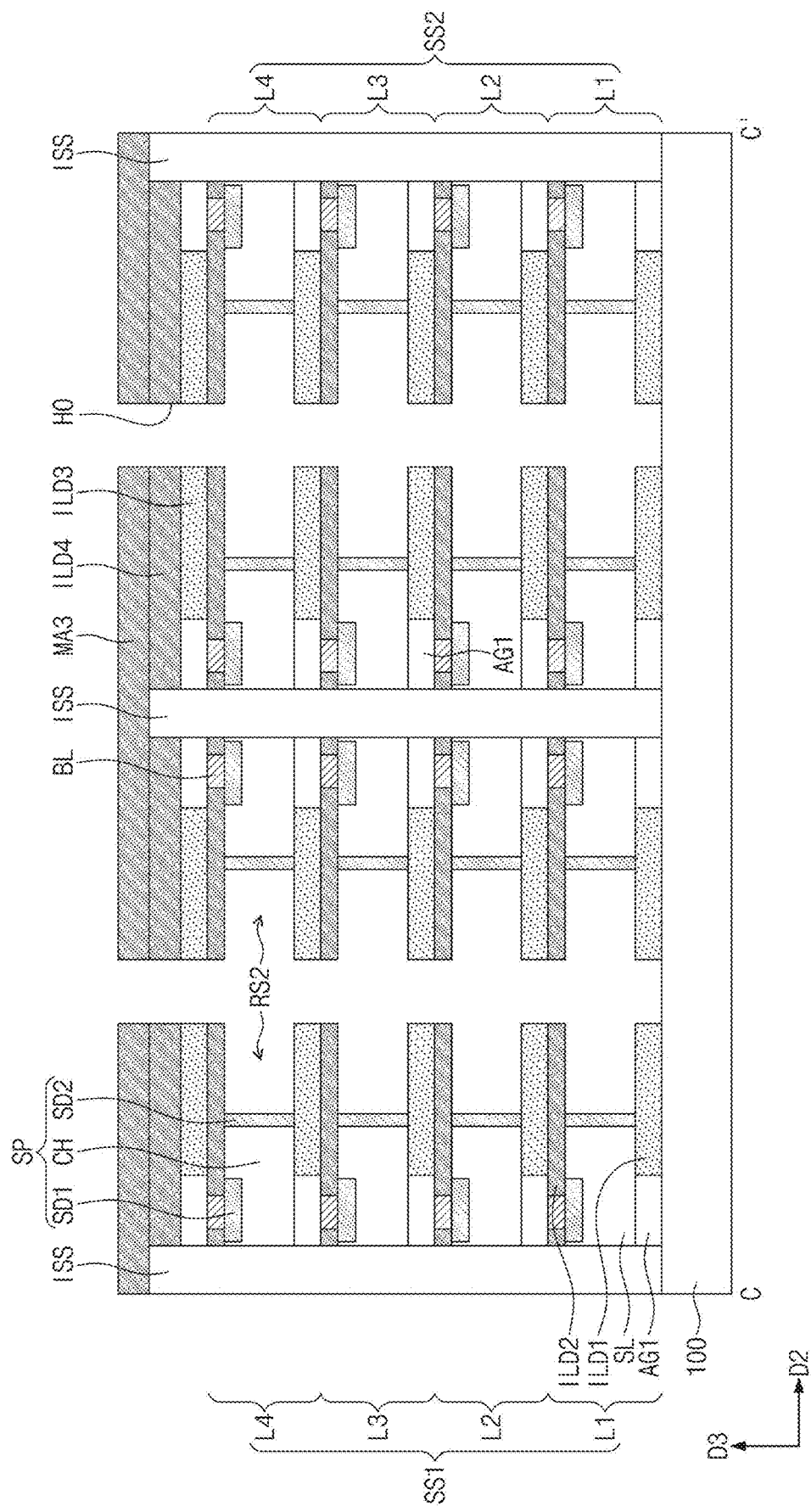
Figure 20:
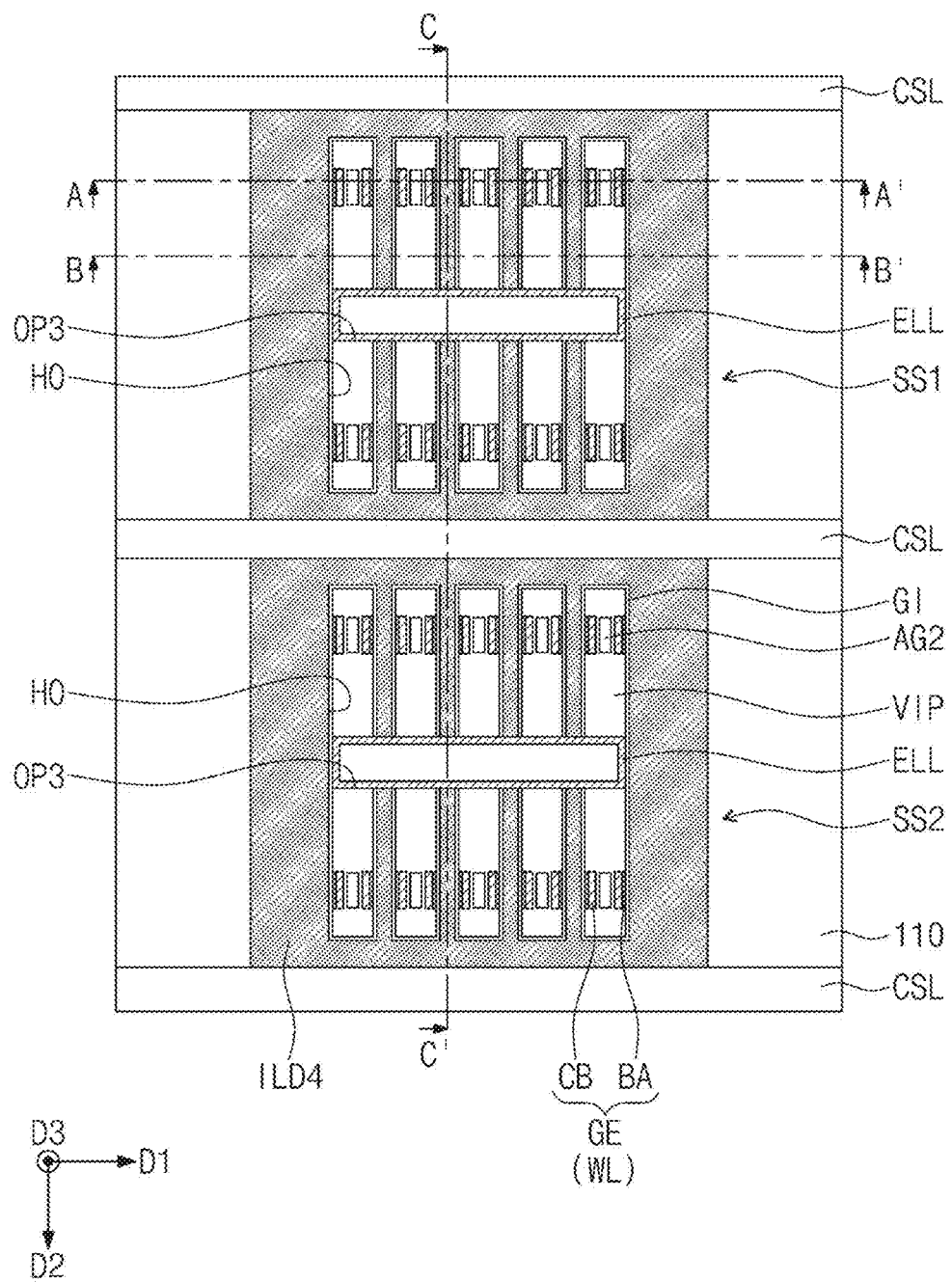
Figure 21A:
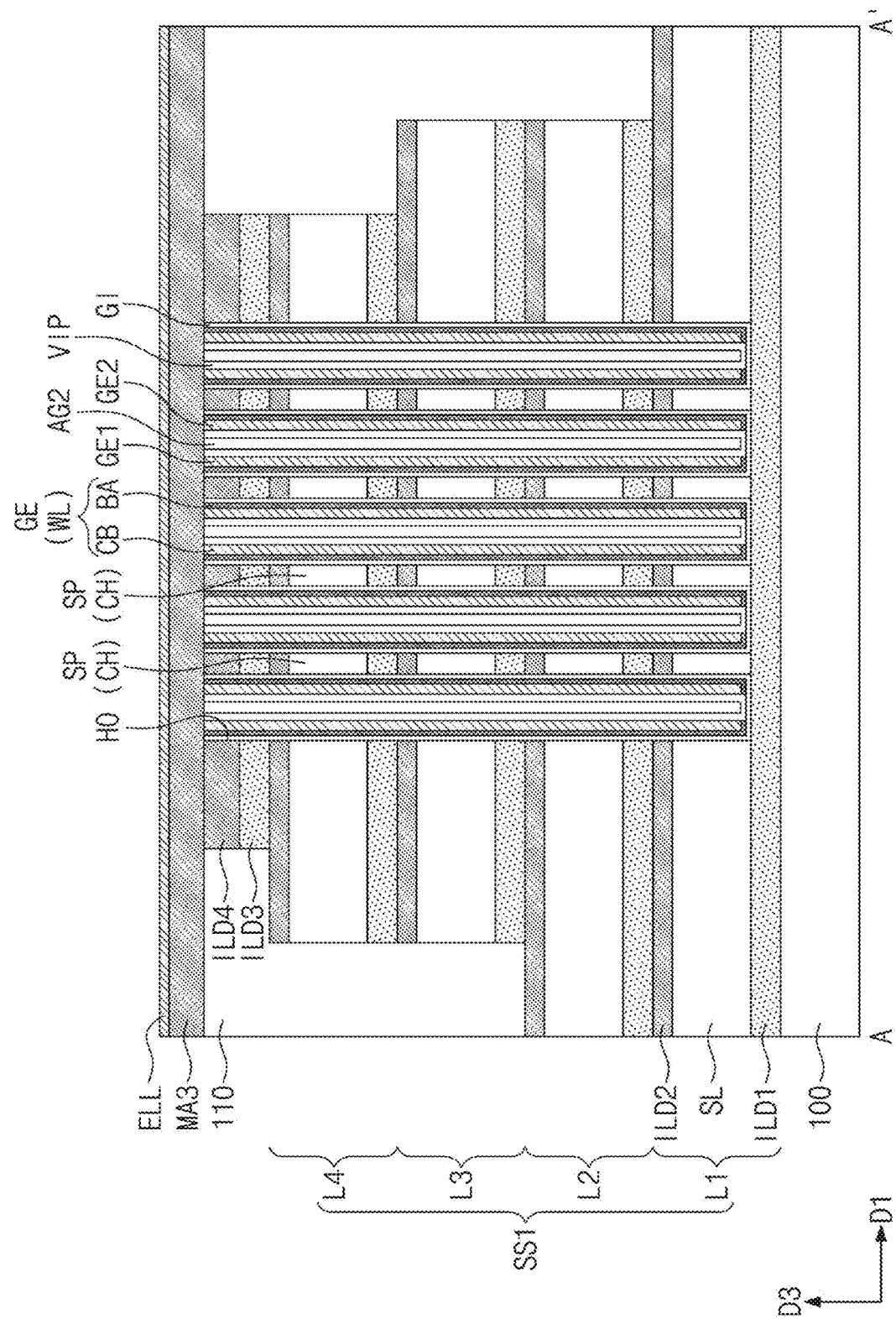
Figure 21B:
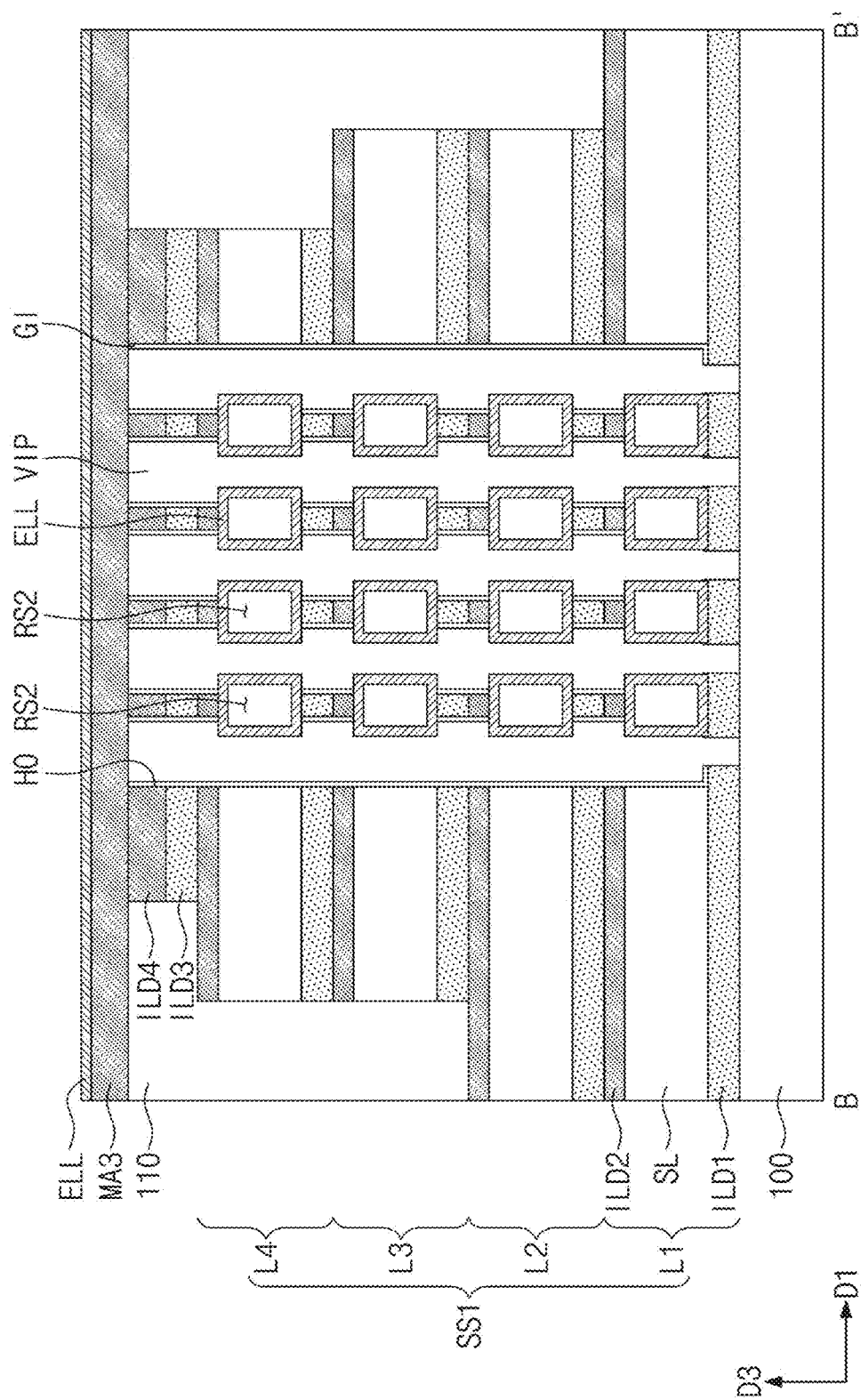
Figure 21C:
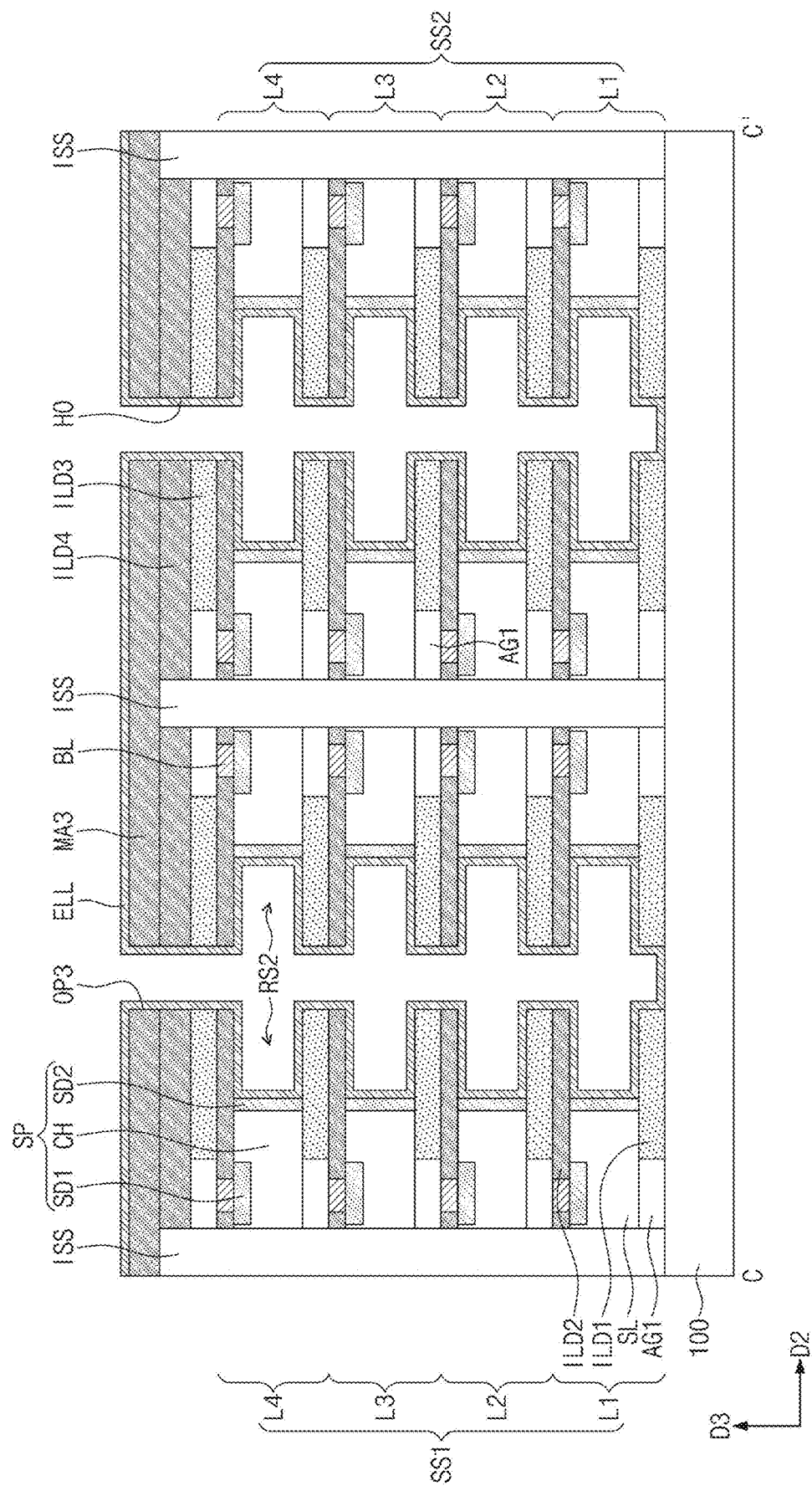

Referring to FIGS. 12, 13A, and 13B, the first mask pattern MA1 may be removed. A dielectric material may be additionally deposited in an empty space in each of the holes HO, such that a vertical dielectric pattern VIP may be formed to fill a corresponding one of the holes HO. The vertical dielectric pattern VIP may be interposed between a pair of neighboring semiconductor patterns SP. The vertical dielectric pattern VIP may be interposed between a pair of neighboring gate electrodes GE.

A pair of neighboring gate electrodes GE in the hole HO may include a first gate electrode GE1 and a second gate electrode GE2. The formation of the vertical dielectric pattern VIP may include removing the dielectric material IM between the first and second gate electrodes GE1 and GE2, depositing a dielectric layer (e.g., a silicon oxide layer) in a space where the dielectric material IM is removed, and forming a second air gap AG2 surrounded by the dielectric layer. The dielectric layer may be deposited by a deposition process that can form a dielectric pattern having a high aspect ratio. The deposition process may have a relatively poor step coverage.

Consequently, the second air gap AG2 may be defined in the vertical dielectric pattern VIP interposed between the first and second gate electrodes GE1 and GE2. The second air gap AG2 may extend in the third direction D3.

Referring to FIGS. 14 and 15A to 15C, a second mask pattern MA2 may be formed on the mold structure MS. The second mask pattern MA2 may include linear openings that extend along the first direction D1.

The second mask pattern MA2 may be used as an etching mask to pattern the mold structure MS, which may form a plurality of stack structures SS1 and SS2. For example, the mold structure MS may be patterned to form a first stack structure SS1 and a second stack structure SS2. The patterning process may result in defining trenches TR at opposite sides of each of the first and second stack structures SS1 and SS2. The trenches TR may partially expose the top surface of the substrate 100. When viewed in plan, the trenches TR may have linear shapes extending in the first direction D1.

The trenches TR may expose opposite sidewalls of each of the first and second stack structures SS1 and SS2. The second dielectric layers ILD2 exposed to the trenches TR may be partially etched, and then bit lines BL may be formed in etched areas where the second dielectric layers ILD2 are etched. The bit lines BL may have linear or bar shapes extending in the first direction D1. For example, the formation of the bit lines BL may include forming a conductive layer (e.g., metal) to fill the etched areas.

Before the bit lines BL are formed, the semiconductor patterns SP exposed through the etched areas may be doped with impurities to form first impurity regions SD1. The bit lines BL may thus be formed on top surfaces of the first impurity regions SD1.

The first dielectric layers ILD1 exposed to the trenches TR may be partially etched to form first air gaps AG1. The first dielectric layers ILD1 may be etched by an isotropic etching process using an etchant that can selectively etch the first dielectric layers ILD1. Each of the first air gaps AG1 may be defined by a bottom surface of the first dielectric layer ILD1, a sidewall of the first dielectric layer ILD1, a top surface of the bit line BL, and a top surface of the second dielectric layer ILD2. The first air gaps AG1 may expose corresponding top surfaces of the bit lines BL.

Referring to FIGS. 16 and 17A to 17C, dielectric structures ISS may be formed to fill corresponding trenches TR. The dielectric structure ISS may be interposed between the first and second stack structures SS1 and SS2. The dielectric structures ISS may have linear shapes extending in the first direction D1.

The dielectric structure ISS may be formed to selectively fill the trench TR, but not to fill the first air gaps AG1. For example, the dielectric structures ISS may be formed using a deposition process whose step coverage is relatively poor. The dielectric structure ISS may include one or more of a silicon oxide layer, a silicon nitride layer, and a silicon oxynitride layer.

Referring to FIGS. 18 and 19A to 19C, a third mask pattern MA3 having third openings OP3 may be formed on the first and second stack structures SS1 and SS2. The third openings OP3 may have linear or bar shapes extending in the first direction D1. When viewed in plan, the third openings OP3 may run across the holes HO penetrating the first and second stack structures SS1 and SS2.

The third mask pattern MA3 may be used as an etching mask to etch the first and second stack structures SS1 and SS2. The etching process may result in a plurality of the holes HO penetrating one of the first and second stack structures SS1 and SS2 being brought together into a single hole HO. The hole HO formed by the etching process may expose sidewalls of the semiconductor patterns SP. The hole HO formed by the etching process may expose sidewalls of the vertical dielectric patterns VIP.

Referring back to FIG. 19C, the semiconductor patterns SP exposed to the hole HO may be selectively etched to form second recesses RS2. The semiconductor patterns SP may be etched by an isotropic etching process using an etchant that can selectively etch the semiconductor patterns SP. The isotropic etching process may cause each of the semiconductor patterns SP to have a reduced width (or length) in the second direction D2. Each of the second recesses RS2 may be defined by a bottom surface of the second dielectric layer ILD2, a sidewall of the semiconductor pattern SP, and a top surface of the first dielectric layer ILD1. The second recess RS2 may be interposed between a pair of neighboring vertical dielectric patterns VIP (see FIG. 19B).

The sidewalls of the semiconductor patterns SP exposed to the hole HO and the second recesses RS2 may be doped with impurities to form second impurity regions SD2. In each of the semiconductor patterns SP, a channel region CH may be defined between the first impurity region SD1 and the second impurity region SD2.

Referring to FIGS. 20 and 21A to 21C, a partial etching may be performed on the vertical dielectric patterns VIP and the gate dielectric layers GI exposed to the hole HO and the second recesses RS2. The vertical dielectric patterns VIP and the gate dielectric layers GI may be etched by an isotropic etching process using an etchant that can selectively etch the vertical dielectric patterns VIP and the gate dielectric layers GI. As the vertical dielectric patterns VIP and the gate dielectric layers GI are partially etched, the second recesses RS2 may expand. For example, the second recess RS2 between a pair of neighboring vertical dielectric patterns VIP may have an increased width in the first direction D1 (see FIG. 21B).

An electrode layer ELL may be conformally formed on an entire surface of the substrate 100. The electrode layer ELL may partially fill the second recesses RS2. The electrode layer ELL may directly cover the second impurity regions SD2.

Referring back to FIGS. 3, 4, and 5A to 5C, the third mask pattern MA3 may be removed. The electrode layer ELL may be patterned to form first electrodes EL1 that fill corresponding second recesses RS2. For example, the formation of the first electrodes EL1 may include forming dielectric patterns to fill corresponding second recesses RS2, and using the dielectric patterns as an etching mask to remove portions of the electrode layer ELL that are not covered with the dielectric patterns.

A removal process may be performed to remove the vertical dielectric patterns VIP and the gate dielectric layers GI adjacent to the first electrodes EL1. A dielectric layer DIL may be conformally formed on the first electrodes LEL1. A second electrode EL2 may be formed on the dielectric layer DL such that the hole HO may be completely filled with the second electrode EL2.

A second interlayer dielectric layer 120 may be formed on the fourth dielectric layer ILD4 and the first interlayer dielectric layer 110. At least one first contact CNT1 may be formed to penetrate the first and second interlayer dielectric layers 110 and 120 and to have connection with at least one bit line BL. At least one second contact CNT2 may be formed to penetrate the second interlayer dielectric layer 120 and to have connection with at least one gate electrode GE.

Figure 22:
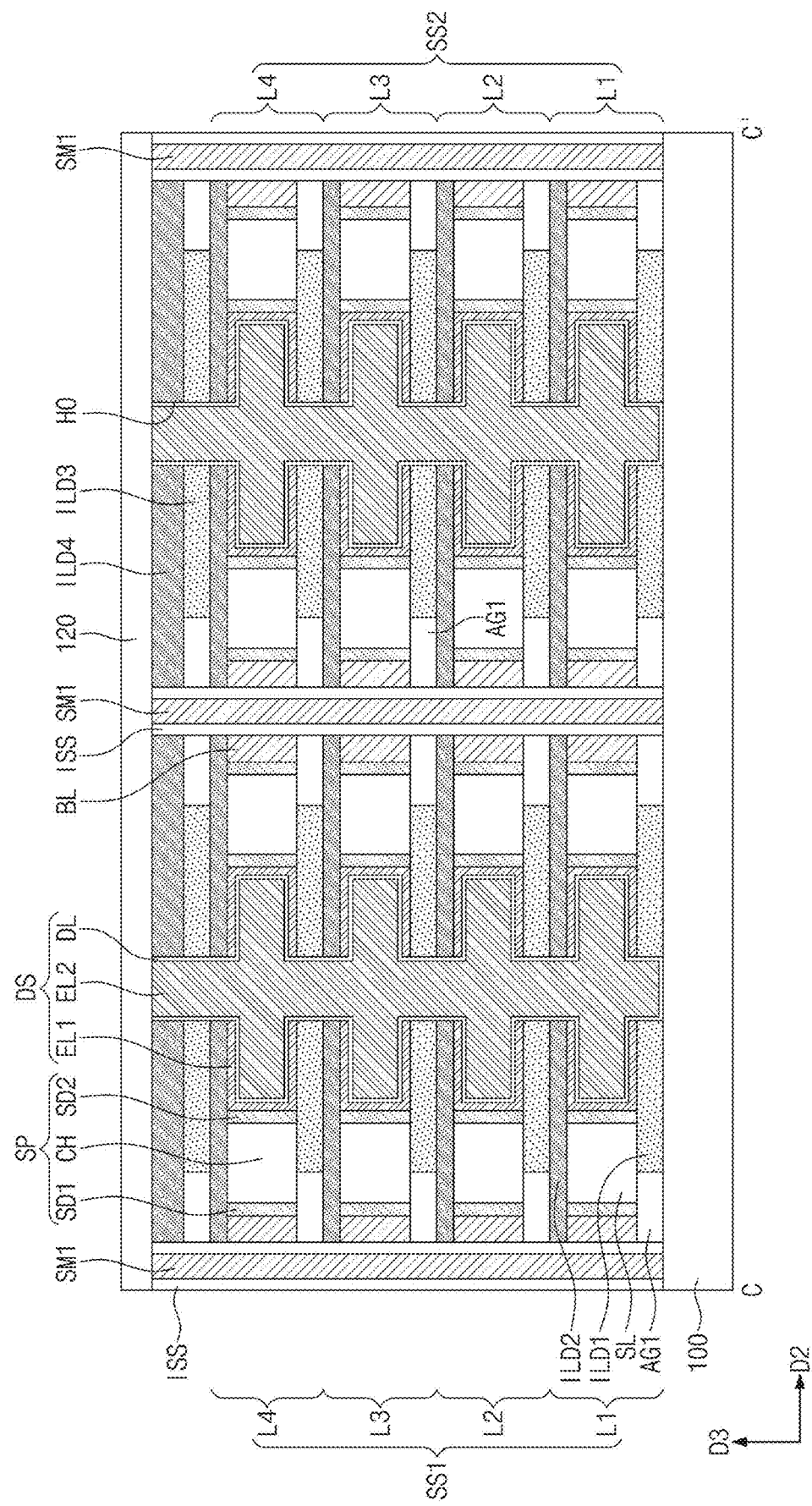
FIG. 22 illustrates a cross-sectional view taken along line C-C' of FIG. 4, showing a three-dimensional semiconductor memory device according to some example embodiments of the present inventive concepts.
Figure 23:
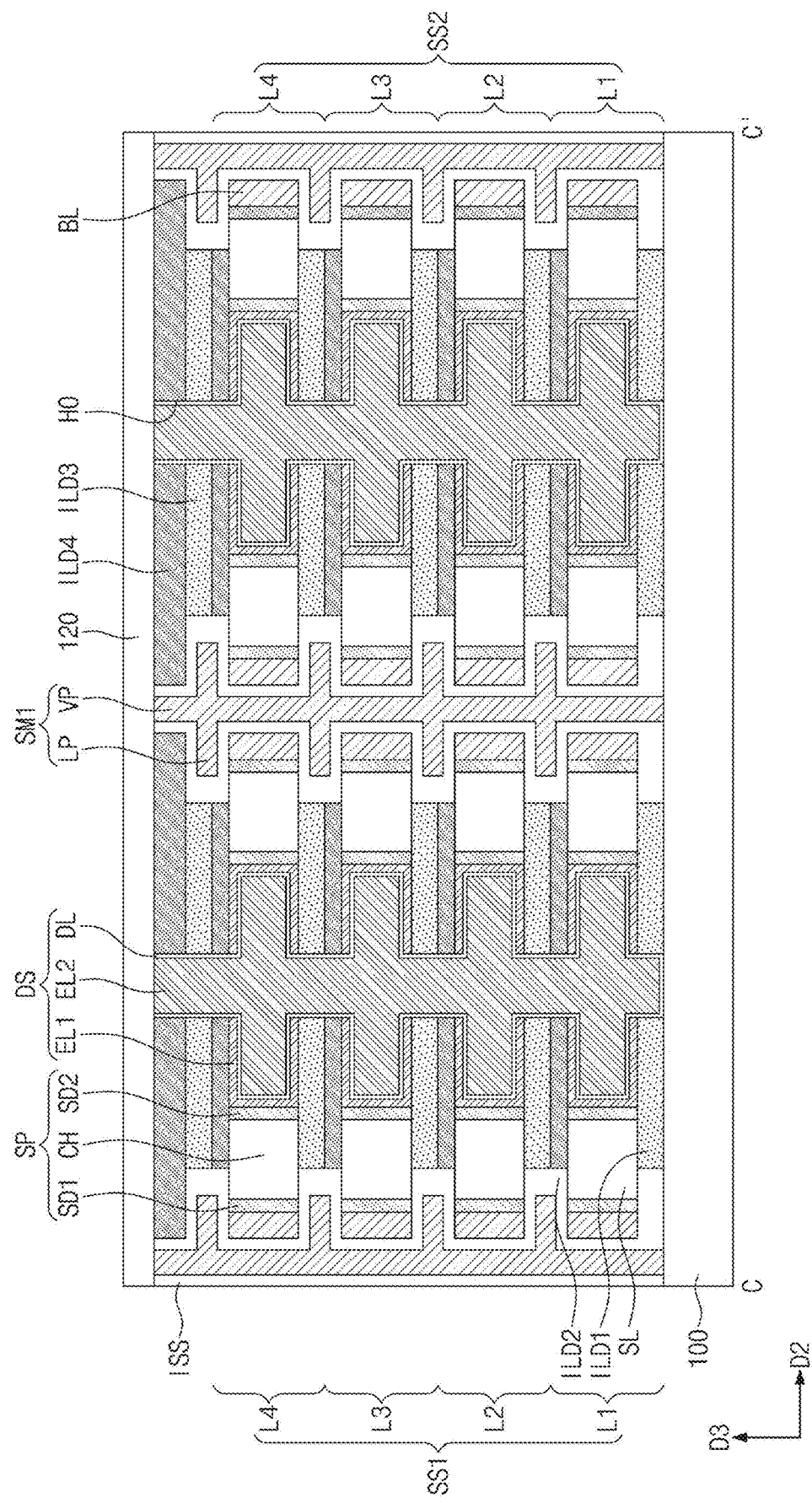
FIG. 23 illustrates a cross-sectional view taken along line C-C' of FIG. 4, showing a three-dimensional semiconductor memory device according to some example embodiments of the present inventive concepts.

FIG. 22 illustrates a cross-sectional view taken along line C-C' of FIG. 4, showing a three-dimensional semiconductor memory device according to some example embodiments of the present inventive concepts. FIG. 23 illustrates a cross-sectional view taken along line C-C' of FIG. 4, showing a three-dimensional semiconductor memory device according to some example embodiments of the present inventive concepts. In the embodiments that follow, a detailed description of technical features repetitive to those discussed above with reference to FIGS. 3, 4, and 5A to 5C will be omitted, and a difference thereof will be discussed in detail.

Referring to FIGS. 3, 4, 5A, 5B, and 22, each of the first, second, third, and fourth layers L1, L2, L3, and L4 may include the bit line BL on a sidewall of the semiconductor layer SL. The bit line BL in each of the first, second, third, and fourth layers L1, L2, L3, and L4 may be located at the same level as that of the semiconductor layer SL. The bit lines BL may directly contact the first impurity region SD1.

A first shield line SM1 may be provided in each of the dielectric structures ISS. The first shield line SM1 may extend in the first direction D1 along the dielectric structure ISS. The first shield line SM1 may be interposed between the bit line BL of the first stack structure SS1 and the bit line BL of the second stack structure SS2. The first shield line SM1 may reduce coupling capacitance caused by interference between the bit line BL of the first stack structure SS1 and the bit line BL of the second stack structure SS2. For example, the first shield line SM1 may be connected to a node that applies a ground voltage.

Referring to FIGS. 3, 4, 5A, 5B, and 23, the bit line BL in each of the first, second, third, and fourth layers L1, L2, L3, and L4 may be located at the same level as that of the semiconductor layer SL. A first shield line SM1 may be provided in each of the dielectric structures ISS.

The first shield line SM1 may include a vertical extension VP that vertically extends and also include horizontal extensions LP that horizontally extend in the second direction D2 from the vertical extension VP. Differently from that discussed above with reference to FIGS. 3, 4, 5A, 5B, and 22, the first air gaps AG1 may not be provided.

The vertical extension VP may be interposed between the bit line BL of the first stack structure SS1 and the bit line BL of the second stack structure SS2. The vertical extension VP may reduce coupling capacitance caused by interference between the bit line BL of the first stack structure SS1 and the bit line BL of the second stack structure SS2.

Each of the horizontal extensions LP may be interposed between the bit lines BL that are vertically adjacent to each other. The horizontal extension LP may reduce coupling capacitance caused by interference between the bit lines BL that are vertically adjacent to each other.

Figure 24:
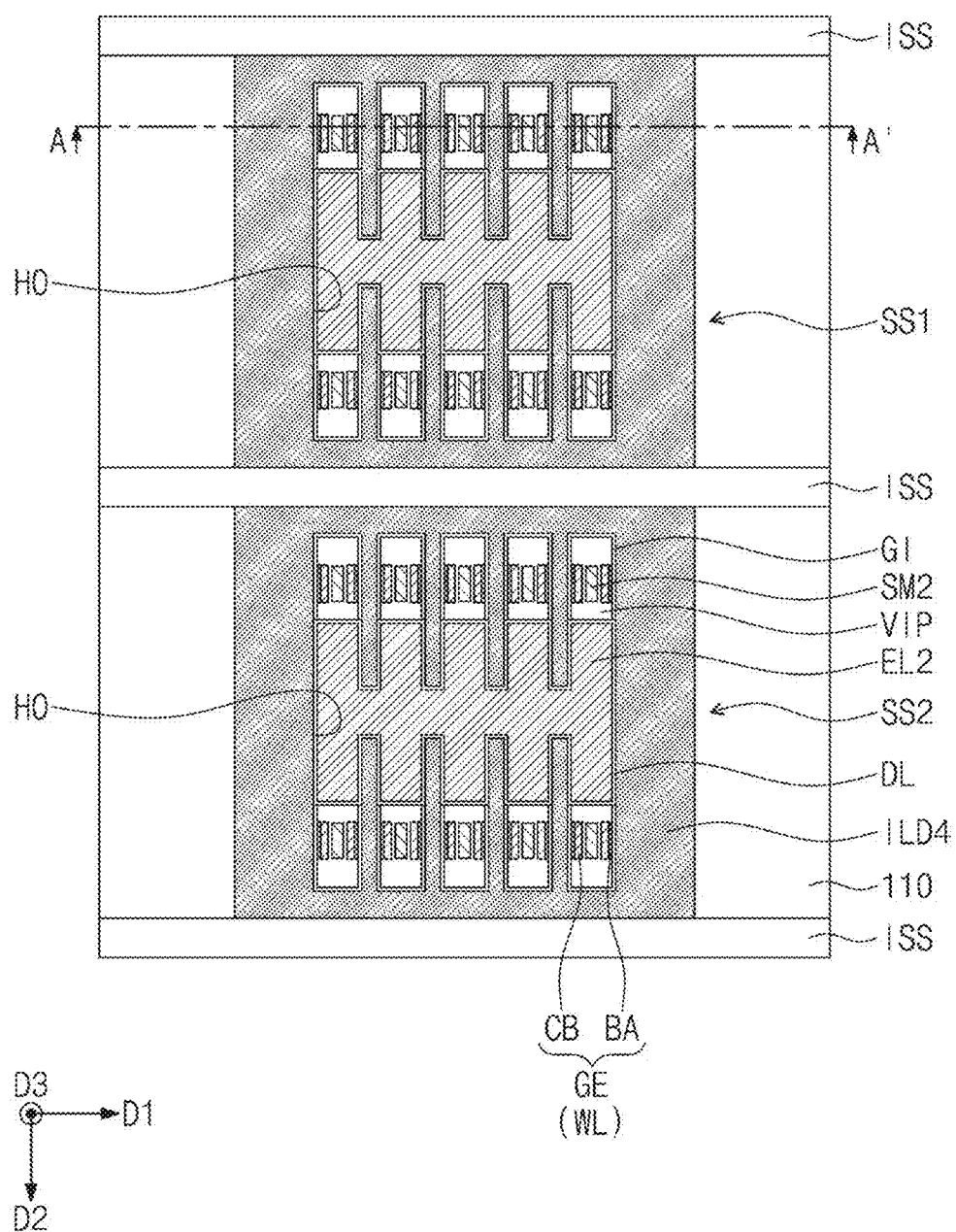
FIG. 24 illustrates a plan view showing a three-dimensional semiconductor memory device according to some example embodiments of the present inventive concepts.
Figure 25:
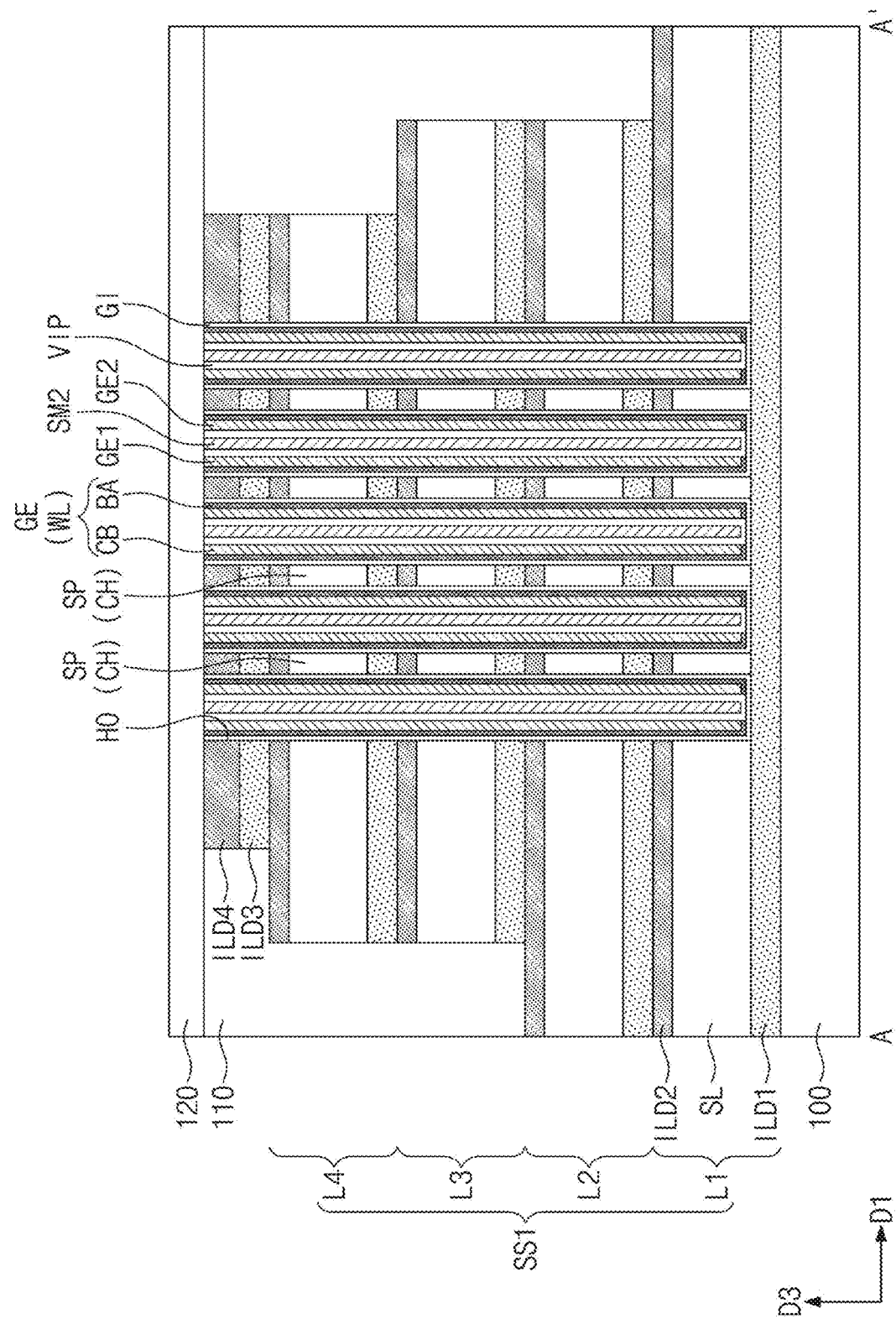
FIG. 25 illustrates a cross-sectional view taken along line A-A' of FIG. 24.

FIG. 24 illustrates a plan view showing a three-dimensional semiconductor memory device according to some example embodiments of the present inventive concepts. FIG. 25 illustrates a cross-sectional view taken along line A-A' of FIG. 24. In the embodiment that follow a detailed description of technical features repetitive to those discussed above with reference to FIGS. 3, 4, and 5A to 5C will be omitted, and a difference thereof will be discussed in detail.

Referring to FIGS. 24 and 25, differently from that discussed above with reference to FIGS. 3, 4, 5a, 5B, and 23, the second air gaps AG2 may not be provided. Each of the vertical dielectric patterns VIP may be provided therein with a second shield line SM2 instead of the second air gap AG2. The second shield line SM2 may have a linear or bar shape extending in a vertical direction (e.g., the third direction D3).

For example, a pair of neighboring gate electrodes GE in the hole HO may include the first gate electrode GE1 and the second gate electrode GE2. The second shield line SM2 may be interposed between the first and second gate electrodes GE1 and GE2. The vertical dielectric pattern VIP may be interposed between the second shield line SM2 and the first gate electrode GE1 and between the second shield line SM2 and the second gate electrode GE2. In this case, the second shield line SM2 may be spaced apart from the first and second gate electrodes GE1 and GE2.

The second shield line SM2 may reduce coupling capacitance caused by interference between the first and second gate electrodes GE1 and GE2.

For example, the first shield line SM1 and the second shield line SM2 may be connected to a node that applies a ground voltage. The gate electrode GE and the second shield line SM2 may be connected to different nodes from each other. For example, the gate electrode GE may be connected to a node that applies the word line with a signal, and the second shield line SM2 may be connected to a node that applies a ground voltage.

A three-dimensional semiconductor memory device according to example embodiments of the present inventive concepts may reduce coupling capacitance caused by interference between bit lines and also reduce coupling capacitance caused by interference between word lines. As a result, the three-dimensional semiconductor memory device may improve in electrical characteristics.

Although some example embodiments of the present inventive concepts have been discussed with reference to accompanying figures, it will be understood that various changes in form and details may be made therein without departing from the spirit and scope of the present inventive concepts. It therefore will be understood that the example embodiments described above are just illustrative but not limitative of the example embodiments.

What is claimed is:

1. A semiconductor memory device, comprising:
a plurality of gate electrodes; and
a stack structure including a plurality of layers vertically stacked on a substrate, the plurality of gate electrodes vertically extending such that the plurality of gate electrodes penetrate the stack structure, each layer of the plurality of layers including,
a plurality of semiconductor patterns extending in parallel along a first direction, the plurality of semiconductor patterns including a first impurity region and a channel region,
a bit line electrically connected to the first impurity region of the semiconductor patterns and extending in a second direction, the second direction intersecting the first direction,
a first air gap interposed between the channel region and the bit line such that the first air gap is between the bit line of a first layer of the plurality of layers and the bit line of a second layer of the plurality of layers, and
a data storage element electrically connected to a corresponding one of the semiconductor patterns, the data storage element including,
a first electrode electrically connected to the corresponding one of the semiconductor patterns,
a dielectric layer covering the first electrode, and
a second electrode on the dielectric layer.

2. The semiconductor memory device of claim 1, wherein each of the semiconductor patterns further comprises:
a second impurity region electrically connected to the data storage element
with the channel region interposed between the first impurity region and the second impurity region.

3. The semiconductor memory device of claim 1, wherein the plurality of gate electrodes includes a first gate electrode and a second gate electrode, the first gate electrode and the second gate electrode each being in a hole penetrating the stack structure, and the semiconductor memory device further comprises:
a second air gap between the first gate electrode and the second gate electrode.

4. The semiconductor memory device of claim 1, wherein the plurality of gate electrodes include a first gate electrode and a second gate electrode, the first gate electrode and the second gate electrode each being in a hole penetrating the stack structure, and the semiconductor memory device further comprises:
a shield line vertically extending between the first gate electrode and the second gate electrode.

5. The semiconductor memory device of claim 1, wherein the stack structure includes a first stack structure and a second stack structure that are adjacent to each other in the first direction, and the semiconductor memory device further comprises:
a shield line extending in the second direction between the bit line of the first stack structure and the bit line of the second stack structure.

6. The semiconductor memory device of claim 1, wherein the bit line is on top surfaces of the plurality of semiconductor patterns.

7. The semiconductor memory device of claim 1, wherein the bit line is at a same level as the plurality of semiconductor patterns.

8. The semiconductor memory device of claim 1, wherein each of the plurality of gate electrodes vertically extends adjacent to sidewalls of the semiconductor patterns that vertically overlap each other.

9. A semiconductor memory device, comprising:
a stack structure including a plurality of layers vertically stacked on a substrate, each of the plurality of layers including,
a plurality of semiconductor patterns extending in parallel along a first direction,
a bit line electrically connected to the semiconductor patterns and extending in a second direction, the second direction intersecting the first direction, and
a data storage element that is electrically connected to a corresponding one of the semiconductor patterns;
a plurality of gate electrodes vertically extending to penetrate the stack structure; and
a structure between the bit line of a first layer of the plurality of layers and the bit line of a second layer of the plurality of layers adjacent to the first layer such that the structure reduces coupling capacitance between adjacent ones of the bit lines, the structure including one of a first air gap and a first shield line.

10. The semiconductor memory device of claim 9, wherein each of the plurality of semiconductor patterns comprises:
a first impurity region electrically connected to the bit line;
a second impurity region electrically connected to the data storage element; and
a channel region adjacent to a corresponding one of the plurality of gate electrodes and interposed between the first impurity region and the second impurity region.

11. The semiconductor memory device of claim 9, wherein the data storage element comprises:
a first electrode electrically connected to the corresponding one of the plurality of semiconductor patterns;
a dielectric layer covering the first electrode; and
a second electrode on the dielectric layer.

12. The semiconductor memory device of claim 9, wherein the plurality of gate electrodes includes a first gate electrode and a second gate electrode, the first gate electrode and the second gate electrode each in a hole penetrating the stack structure, and the semiconductor memory device further comprises:
a second air gap between the first and second gate electrodes.

13. The semiconductor memory device of claim 9, wherein the plurality of gate electrodes include a first gate electrode and a second gate electrode, the first gate electrode and the second gate electrode each in a hole penetrating the stack structure, and the semiconductor memory device further comprises:
a shield line vertically extending between the first gate electrode and the second gate electrode.

14. The semiconductor memory device of claim 9, wherein
the stack structure includes a first stack structure and a second stack structure that are adjacent to each other in the first direction, and
the first shield line extends in the second direction between the bit line of the first stack structure and the bit line of the second stack structure.

15. A semiconductor memory device, comprising:
a stack structure including a plurality of layers vertically stacked on a substrate, the plurality of layers including,
a first semiconductor pattern and a second semiconductor pattern extending in parallel along a first direction,
a bit line electrically connected to the first semiconductor pattern and the second semiconductor pattern, the bit line extending in a second direction intersecting the first direction, and
a data storage element electrically connected to a corresponding one of the first semiconductor pattern and the second semiconductor pattern;
a first gate electrode and a second gate electrode, the first gate electrode and the second gate electrode vertically extending in a hole penetrating the stack structure, the first gate electrode and the second gate electrode being adjacent to the first semiconductor pattern and the second semiconductor pattern, respectively; and
a structure between the first gate electrode and the second gate electrode such that the structure reduces coupling capacitance between the first gate electrode and the second gate electrode, the structure including one of a first air gap and a first shield line.

16. The semiconductor memory device of claim 15, wherein each of the first semiconductor pattern and the second semiconductor pattern comprises:
a first impurity region electrically connected to the bit line;
a second impurity region electrically connected to the data storage element; and
a channel region adjacent to a corresponding one of the first gate electrode and the second gate electrode and between the first impurity region and the second impurity region.

17. The semiconductor memory device of claim 15, wherein the data storage element comprises:
a first electrode electrically connected to a corresponding one of the first semiconductor pattern and the second semiconductor pattern;
a dielectric layer covering the first electrode; and
a second electrode on the dielectric layer.

18. The semiconductor memory device of claim 15, further comprising:
a second air gap between the bit line of a first layer of the plurality of layers and the bit line of a second layer of the plurality of layers.

19. The semiconductor memory device of claim 15, wherein the stack structure includes a first stack structure and a second stack structure, the first stack structure and the second stack structure being adjacent to each other in the first direction, and the semiconductor memory device further comprises,
a second shield line extending in the second direction between the bit line of the first stack structure and the bit line of the second stack structure.

* * * * *